US007133087B2

(12) United States Patent
Kim

(10) Patent No.: US 7,133,087 B2
(45) Date of Patent: Nov. 7, 2006

(54) ARRAY SUBSTRATE OF LIQUID CRYSTAL DISPLAY AND FABRICATING METHOD THEREOF

(75) Inventor: Woo Hyun Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 490 days.

(21) Appl. No.: 10/141,848

(22) Filed: May 10, 2002

(65) Prior Publication Data

US 2002/0180901 A1 Dec. 5, 2002

(30) Foreign Application Priority Data

Jun. 5, 2001 (KR) ..................... 10-2001-0031511

(51) Int. Cl.

*G02F 1/1343* (2006.01)
*G02F 1/136* (2006.01)
*H01L 29/04* (2006.01)
*H01L 29/15* (2006.01)
*G09G 3/34* (2006.01)

(52) U.S. Cl. ........................... 349/39; 349/42; 257/59; 257/72; 345/92

(58) Field of Classification Search .................. 349/38, 349/139, 42; 257/59, 72; 345/92
See application file for complete search history.

(56) References Cited

U.S. PATENT DOCUMENTS 5,905,548 A * 5/1999 Shimada ..................... 349/38
6,466,281 B1 * 10/2002 Huang et al. ................. 349/44
6,610,997 B1 * 8/2003 Murade ...................... 257/72

FOREIGN PATENT DOCUMENTS

| | | |
|---|---|---|
| JP | 2001-66633 | 3/2001 |
| KR | 1994-11988 | 6/1994 |
| KR | 2000-2804 | 1/2000 |
| KR | 10-2001-0026625 | 4/2001 |

* cited by examiner

*Primary Examiner*—David Nelms
*Assistant Examiner*—Hoan C. Nguyen
(74) *Attorney, Agent, or Firm*—Morgan, Lewis & Bockius LLP

(57) ABSTRACT

An array substrate of a liquid crystal display includes a gate line, a data line crossing the gate line, a thin film transistor including a gate electrode connected to the gate line, a semiconductor layer having first and second sides, a source electrode contacting the first side of the semiconductor layer and connected to the data line, and a drain electrode contacting the second side of the semiconductor layer, a gate insulating film provided between the gate line and the data line, an organic protective film formed on the gate insulating film, a capacitor common line provided on the organic protective film to overlap the gate line, an upper insulating layer provided on the organic protective film, and a pixel electrode provided on the upper insulating layer partially overlapping the capacitor common line and the data line, the pixel electrode connected to the drain electrode via a contact hole through the upper insulating layer and the organic protective film.

9 Claims, 32 Drawing Sheets

91 87 III' 75 87 83 73 85 III 90a 93

90a 91 87 89 83 79 77 71 93 79 73 81 85 75

ARRAY SUBSTRATE OF LIQUID CRYSTAL DISPLAY AND FABRICATING METHOD THEREOF

The present invention claims the benefit of Korean Patent Application No. P2001-31511 filed in Korea on Jun. 5, 2001, which is hereby incorporated by reference.

BACKGROUND OF THE INVENTION

1. Field of the Invention

This invention relates to a liquid crystal display, and more particularly to an array substrate of a liquid crystal display and a fabricating method thereof that are adaptive for increasing an aperture ratio and a capacitance value of a storage capacitor.

2. Discussion of the Related Art

Generally, a liquid crystal display (LCD) controls light transmittances of liquid crystal cells in response to a video signal, thereby display image data (picture). An active matrix LCD having a switching device for each liquid crystal cell is suitable for displaying a moving picture. In general, the active matrix LCD uses a thin film transistor (TFT) as the switching device.

The LCD uses a storage capacitor for sustaining a voltage charged in a liquid crystal cell to ensure stability of a gray level display. The storage capacitor may be classified into two categories: a storage-on-gate (SOG) system that overlaps a portion of the (n−1)th gate line with the nth pixel electrode to form a storage capacitor of the nth pixel; and a storage-on-common (SOC) system that provides a separate common electrode at a lower portion of a pixel electrode to form a storage capacitor.

FIG. 1 is a plan view showing a structure of an array substrate of a conventional LCD adopting a storage-on-gate system, and FIG. 2 is a cross sectional view of the array substrate taking along I–I' in FIG. 1. In FIGS. 1 and 2, a lower substrate 11 of the LCD includes a TFT arranged at an intersection between a gate line 15' and a data line 17, a pixel electrode 33 connected to a drain electrode 27 of the TFT, and a storage capacitor positioned at an overlapping portion between the pixel electrode 33 and the pre-stage gate line 15.

The TFT includes a gate electrode 13 connected to the gate line 15', a source electrode 25 connected to the data line 17, and a drain electrode 27 connected, via a first contact hole 30*a*, to the pixel electrode 33. The TFT further includes a gate insulating film 19 for electrically insulating the gate electrode 13 and the source and drain electrodes 25 and 17, and semiconductor layers 21 and 23 defining a conduction channel between the source electrode 25 and the drain electrode 27 by application of a gate voltage to the gate electrode 13. The TFT responds to a gate signal from the gate line 15' to selectively apply a data signal from the data line 17 to the pixel electrode 33.

The pixel electrode 33 is positioned at a cell area divided by the data line 17 and the gate line 15' and is made from a transparent conductive material having a high light transmittance. The pixel electrode 33 is provided on a protective film 31 coated on an entire surface of the lower substrate 11 and is electrically connected, via the first contact hole 30*a* defined at the protective film 31, to the drain electrode 27. The pixel electrode 33 generates a potential difference from a common transparent electrode (not shown) provided at an upper substrate (not shown) by the data signal applied via the TFT. This potential difference allows a liquid crystal positioned between the lower substrate 11 and the upper substrate (not shown) to change a liquid crystal molecule arrangement owing to its dielectric anisotropy characteristic. Accordingly, an arrangement of the liquid crystal molecules is changed for each pixel in accordance with the data voltage applied via the TFT, thereby displaying image data information on the LCD.

The storage capacitor should have a large capacitance value enough to keep the pixel voltage stable. Accordingly, the storage capacitor includes a capacitor electrode 29 electrically connected, via a second contact hole 30*b*, to the pixel electrode, and a gate line 15 having the gate insulating film 19 disposed therebetween.

FIGS. 3A to 3E are cross sectional views showing a method of fabricating the array substrate of the LCD shown in FIG. 2.

In FIG. 3A, the gate electrode 13 and the gate line 15 are provided on the substrate 11. The gate electrode 13 and the gate line 15 are formed by depositing aluminum (Al) or copper (Cu) material, using a deposition technique such as a sputtering, and then patterning the material.

In FIG. 3B, a gate insulating film 19, an active layer 21 and an ohmic contact layer 23 are provided on the substrate 11. The gate insulating film 19 is formed by depositing an insulating material such as silicon nitride ($SiN_x$) or silicon oxide ($SiO_x$) using a plasma enhanced chemical vapor deposition (PECVD) technique to cover the gate electrode 13 and the gate line 15. The active layer 21 and the ohmic contact layer 23 are formed by sequentially depositing two semiconductor layers on the gate insulating film 19 and patterning the deposited semiconductor layers. The active layer 21 is formed from amorphous silicon that is not doped with an impurity, and the ohmic contact layer 23 is formed from amorphous silicon doped with an n-type or p-type impurity at a high concentration.

In FIG. 3C, a data line 17 (in FIG. 1), the source and drain electrodes 25 and 27 and the capacitor electrode 29 are provided on the gate insulating film 19 by depositing a metal layer using a CVD or sputtering technique and patterning. After the source and drain electrodes 25 and 27 are patterned, the ohmic contact layer 23 at an area corresponding to the gate electrode 13 is patterned to expose the active layer 21. The area of the active layer 21 corresponding to the gate electrode 13 between the source and drain electrodes 25 and 27 provides a channel. The capacitor electrode 29 overlaps with the gate line 15. The data line 17 (in FIG. 1), the source and drain electrodes 25 and 27, and the capacitor electrode 29 are made from chrome (Cr) or molybdenum (Mo) material.

In FIG. 3D, a protective film 31 having first and second contact holes 30*a* and 30*b* is provided. The protective layer 31 is formed by depositing an insulating material on the gate insulating layer 19 and patterning the material to cover the source and drain electrodes 25 and 27. The protective film 31 is made from an inorganic insulating material such as silicon nitride ($SiN_x$) or silicon oxide ($SiO_x$).

In FIG. 3E, a pixel electrode 33 is provided on the protective film 31. The pixel electrode 33 is formed by depositing a transparent conductive material on the protective film 31 and then patterning the material. The pixel electrode 33 is electrically connected, via the first contact hole 30*a*, to the drain electrode 27 and is electrically connected, via the second contact hole 30*b*, to the capacitor electrode 29. The pixel electrode 33 is made from a transparent conductive material such as indium-tin-oxide (ITO), indium-zinc-oxide (IZO) or indium-tin-zinc-oxide (ITZO).

FIG. 4 is a plan view showing a structure of an array substrate of a conventional LCD adopting a storage-on-common system, and FIG. 5 is a cross sectional view of the array substrate taking along II–II' in FIG. 4. In FIG. 4, a storage capacitor 50 is positioned at center portion of a pixel area. The storage capacitor 50 should have a capacitance value large enough to keep a pixel voltage stable. Accordingly, the storage capacitor 50 includes a pixel electrode 55 electrically connected to a drain electrode 59, and a capacitor common electrode 45 having a gate insulating film 49 disposed therebetween.

FIGS. 6A to 6D are cross sectional views showing a method of fabricating the array substrate of the LCD shown in FIG. 5.

In FIG. 6A, a gate electrode 43, a capacitor electrode 45, and a gate line 47 are provided on the substrate 41 by depositing aluminum (Al) or copper (Cu) material using a deposition technique such as a sputtering and then patterning the material.

In FIG. 6B, a gate insulating film 49, an active layer 51, and an ohmic contact layer 53 are provided on the substrate 41. The gate insulating film 49 is formed by depositing an insulating material such as silicon nitride ($SiN_x$) or silicon oxide ($SiO_x$) using a plasma enhanced chemical vapor deposition (PECVD) technique to cover the gate electrode 43, the capacitor common electrode 45, and the gate line 47. The active layer 51 and the ohmic contact layer 53 are formed by sequentially depositing two semiconductor layers on the gate insulating film 49 and then patterning the disposed semiconductor layers. The active layer 51 is formed from amorphous silicon that is not doped with an impurity, and the ohmic contact layer 53 is formed from amorphous silicon doped with an n-type or p-type impurity at a high concentration.

In FIG. 6C, a pixel electrode 55, a data line 63, and source and drain electrodes 57 and 59 are provided on the gate insulating film 49. The pixel electrode 55 is formed by depositing a transparent conductive material on the gate insulating film 49 and then patterning the material. The pixel electrode 55 is made from any one of ITO, IZO and ITZO. Subsequently, the data line 63, and the source and drain electrodes 57 and 59 are provided. The data line 63, and the source and drain electrodes 57 and 59 are formed by depositing a metal layer using a CVD or sputtering technique, and then patterning the metal layer. After the source and drain electrodes 57 and 59 are patterned, the ohmic contact layer 53 is patterned at an area corresponding to the gate electrode 43 to expose the active layer 51. The area of the active layer 51 corresponding to the gate electrode 43 between the source and drain electrodes 57 and 59 provides a channel. The drain electrode 59 electrically contacts the pixel electrode 55 without any contact hole. The data line 63 and the source and drain electrodes 57 and 59 are made from chrome (Cr) or molybdenum (Mo).

In FIG. 6D, a protective film 61 is provided at a TFT area. The protective film 61 is formed by depositing an insulating material on the gate insulating layer 19, and then patterning the material to cover the source and drain electrodes 57 and 59. The protective film 61 is made from an inorganic insulating material such as silicon nitride ($SiN_x$) or silicon oxide ($SiO_x$).

To overcome a flicker phenomenon, the capacitance of the storage capacitor is increased by increasing an area of the capacitor electrode. Accordingly, in a storage-on-gate system, a width of the gate line is increased to increase the capacitance of the storage capacitor. However, since an aperture ratio is reduced, and a line delay effect of a gate signal is enhanced when a width of the gate line is widened, there is a limit in widening the gate line. Furthermore, since the LCD of a storage-on-common system has the storage capacitor provided at a center of the pixel cell, the aperture ratio is reduced more than the LCD of a storage-on-gate system. As previously described, as an area of the capacitor electrode is increased, aperture ratio is reduced. In particular, high pixel density, ferroelectric, and semi-ferroelectric LCD's require high capacitance storage capacitors and high aperture ratios.

SUMMARY OF THE INVENTION

Accordingly, the present invention is directed to an array substrate of a liquid crystal display and fabricating method thereof that substantially obviates one or more of the problems due to limitations and disadvantages of the related art.

An object of the present invention is to provide an array substrate of a liquid crystal display and a fabricating method thereof that are adaptive for increasing a capacitance value of a storage capacitor without reducing an aperture ratio.

Another object of the present invention is to provide an array substrate of a liquid crystal display with improved performance that can be efficiently manufactured.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an array substrate of a liquid crystal display includes a gate line, a data line crossing the gate line, a thin film transistor including a gate electrode connected to the gate line, a semiconductor layer having first and second sides, a source electrode contacting the first side of the semiconductor layer and connected to the data line, and a drain electrode contacting the second side of the semiconductor layer, a gate insulating film provided between the gate line and the data line, an organic protective film formed on the gate insulating film, a capacitor common line provided on the organic protective film to overlap the gate line, an upper insulating layer provided on the organic protective film, and a pixel electrode provided on the upper insulating layer partially overlapping the capacitor common line and the data line, the pixel electrodeconnected to the drain electrode via a contact hole through the upper insulating layer and the organic protective film.

In another aspect, an array substrate of a liquid crystal display includes a gate line, a data line crossing the gate line, a thin film transistor including a gate electrode connected to the gate line, a semiconductor layer having first and second sides, a source electrode contacting the first side of the semiconductor layer and connected to the data line, and a drain electrode contacting the second side of the semiconductor layer, a gate insulating film provided between the gate line and the data line, a capacitor electrode provided on the gate insulating film to overlap the gate line, the capacitor electrode includes a plurality of sub-pixel units, an organic protective film formed on the gate insulating film, a capacitor common line provided on the organic protective film to overlap the gate line, an upper insulating layer provided on the organic protective film, and a pixel electrode partially overlapping the capacitor common line and the data line, the pixel electrode connected to the drain electrode and capacitor electrode via first and second contact holes, respectively, provided through the upper insulating layer and the organic protective film.

In another aspect, a method of fabricating an array substrate of a liquid crystal display includes forming a gate line and a gate electrode connected to the gate line on a substrate, forming a gate insulating film on the substrate, forming a semiconductor layer overlapping the gate electrode, forming a data line crossing the gate line, a source electrode on a first side of the semiconductor layer and connected to the data line, and a drain electrode on a second side of the semiconductor layer, forming an organic protective film on the gate insulating film, forming a capacitor common line overlapping the gate line, forming an upper insulating layer on the organic protective film, forming a contact hole through the upper insulating layer and the organic protective film, and forming a pixel electrode partially overlapping the capacitor common line and the data line, and connected to the drain electrode via the contact hole.

In another aspect, a method of fabricating an array substrate of a liquid crystal display includes forming a gate line and a gate electrode connected to the gate line on a substrate, forming a gate insulating film on the substrate, forming a semiconductor layer overlapping the gate insulating film above the gate electrode, forming a data line crossing the gate line, a source electrode connected to the data line contacting a first side of a semiconductor layer, a drain electrode contacting a second side of the semiconductor layer, and a capacitor electrode overlapping the gate line to form a sub-pixel unit, forming an organic protective film on the gate insulating film, the source and drain electrodes, and the capacitor electrode, forming a capacitor common line overlapping the gate line, forming an upper insulating layer on the organic protective film, forming first and second contact holes going through the upper insulating layer and the organic protective film, and forming a pixel electrode partially overlapping the capacitor common line and the data line and connected to the drain electrode via the first contact hole and to the capacitor electrode via the second contact hole.

In another aspect, an array substrate of a liquid crystal display includes a gate line, a data line crossing the gate line, a gate insulating film between the gate line and the data line, a thin film transistor connected to the gate line and the data line, a pixel electrode connected to the thin film transistor, the pixel electrode at least partially overlapping the gate line and the data line with an organic protective film and an upper dielectric layer therebetween, and a storage capacitor including at least a capacitor common line overlapping the gate line, and the pixel electrode overlapping the capacitor common electrode.

In another aspect, an array substrate of a liquid crystal display includes a gate line, a data line crossing the gate line, a gate insulating film between the gate line and the data line, a thin film transistor connected to the gate line and the data line, a pixel electrode connected to the thin film transistor, the pixel electrode partially overlapping the data line, the gate line, and the gate insulating film with an organic protective film and an upper dielectric layer therebetween, a first storage capacitor including a capacitor electrode connected to the pixel electrode via a contact hole through the organic protective film and the upper dielectric layer, and a second storage capacitor including a capacitor common line overlapping the gate line, and the pixel electrode overlapping the capacitor common electrode, the first storage capacitor being connected, in parallel, to the second storage capacitor.

In the array substrate, the capacitor common line includes an arm member partially overlapping with each side portion of the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
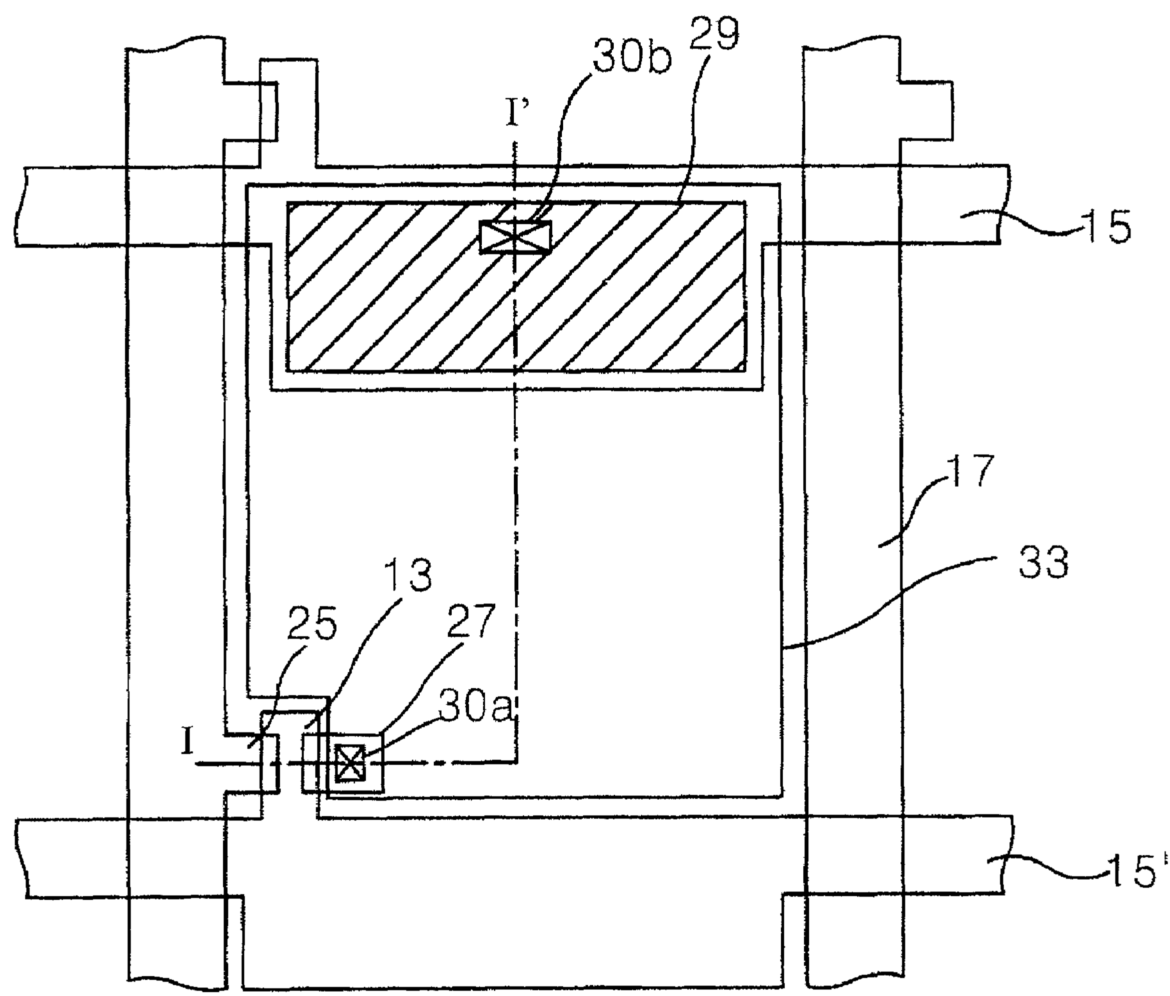
FIG. 1 is a plan view showing a structure of an array substrate of a conventional liquid crystal display adopting a storage-on-gate system.
Figure 2:
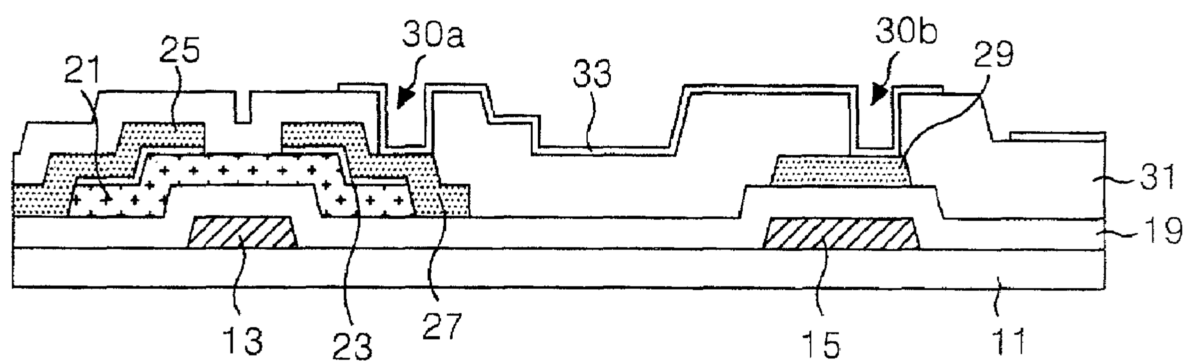
FIG. 2 is a cross sectional view of the array substrate taken along I–I' in FIG. 1.
Figure 3A:
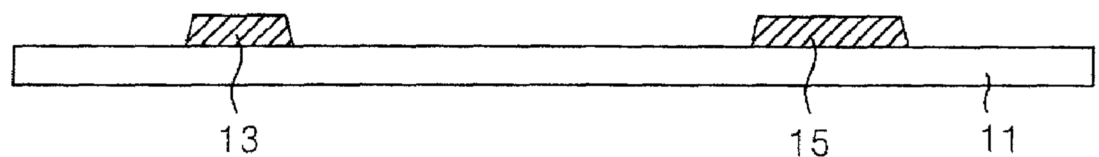
FIGS. 3A to 3E are cross sectional views of a method of fabricating the array substrate shown in FIG. 2 according to the conventional art.
Figure 3B:
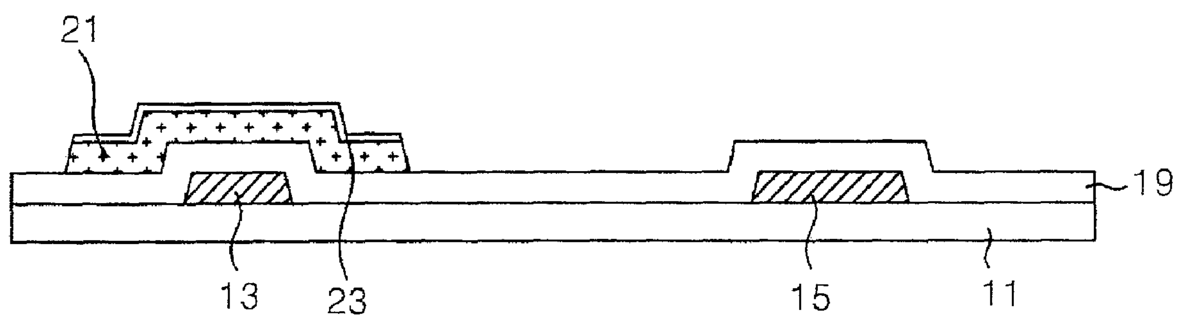
Figure 3C:
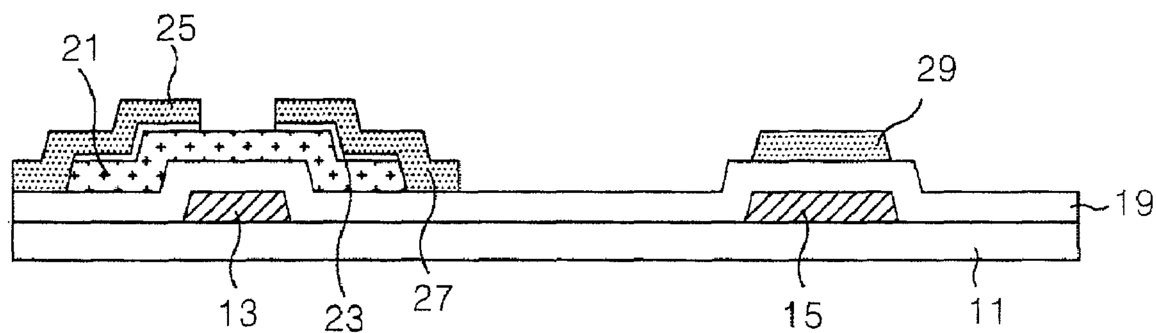
Figure 3D:
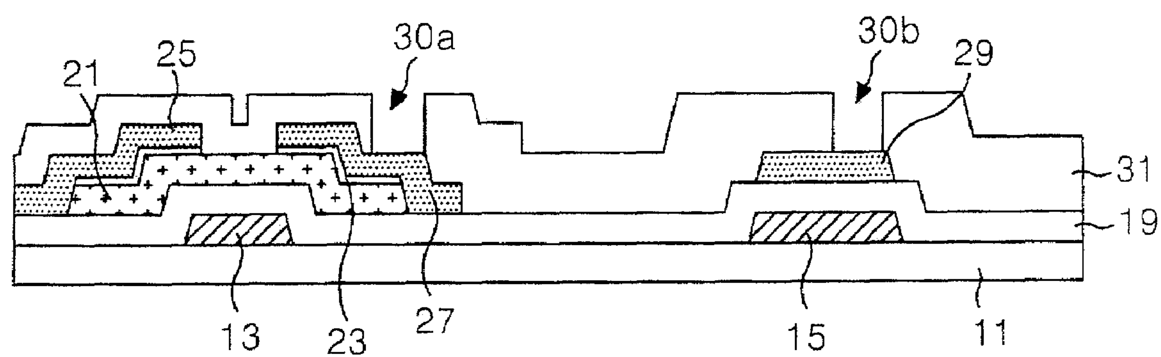
Figure 3E:
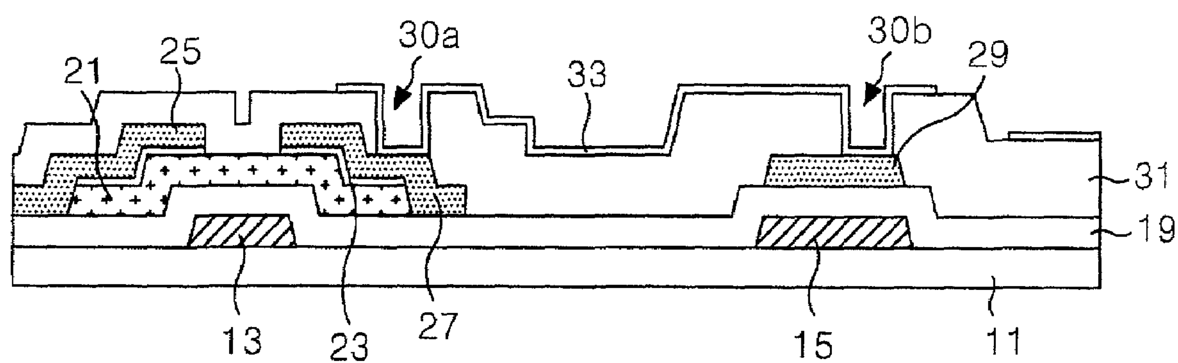
Figure 4:
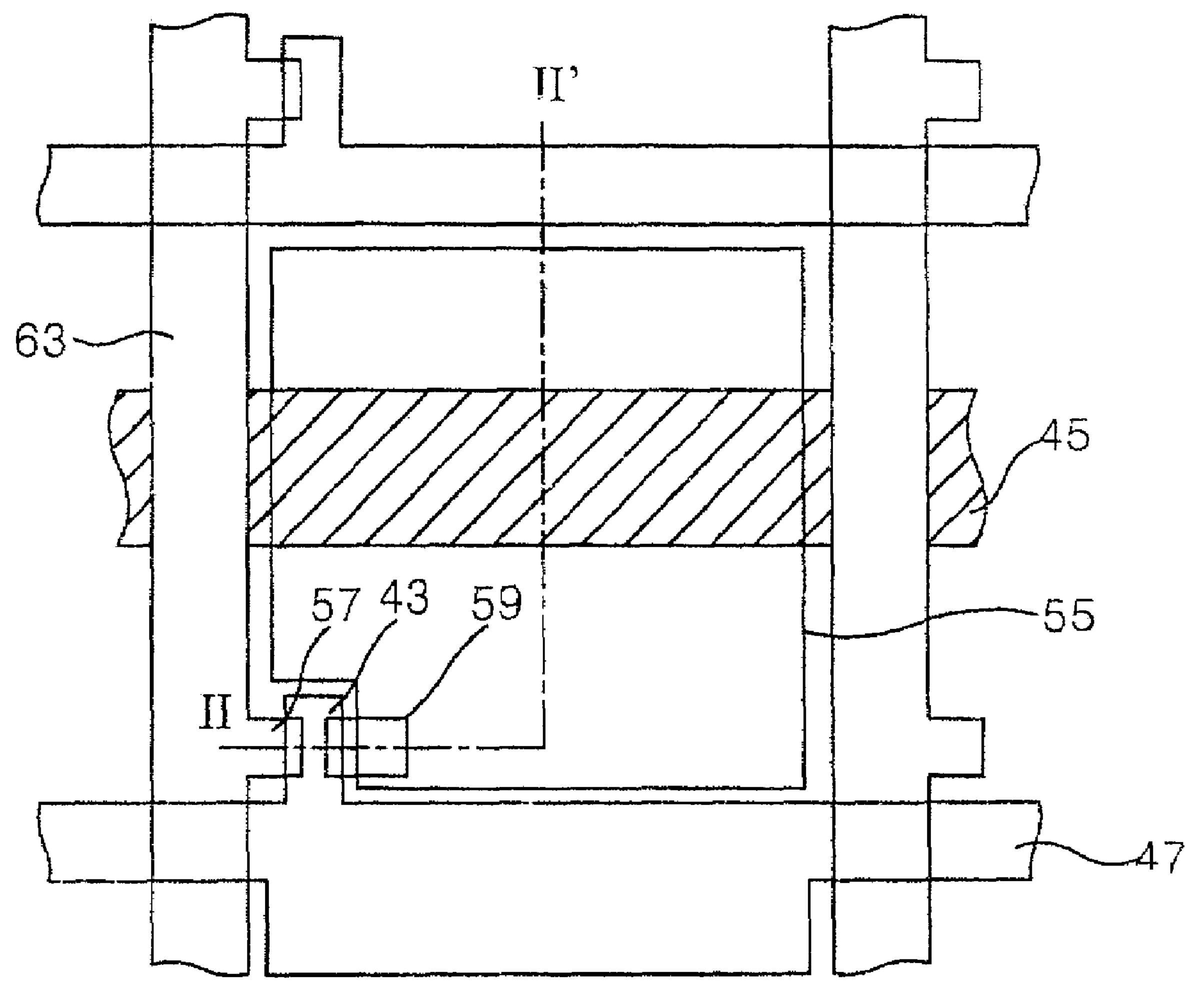
FIG. 4 is a plan view showing a structure of an array substrate of a conventional liquid crystal display adopting a storage-on-common system.
Figure 5:
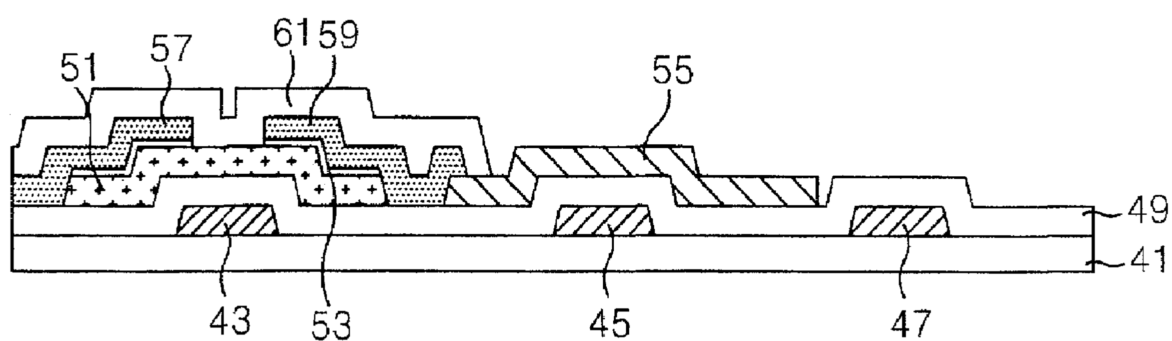
FIG. 5 is a cross sectional view of the array substrate taken along II–II' in FIG. 1.
Figure 6A:
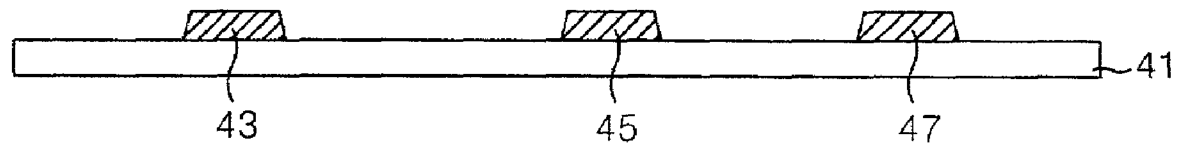
FIGS. 6A to 6D are cross sectional views of a method of fabricating the array substrate shown in FIG. 5 according to the conventional art.
Figure 6B:
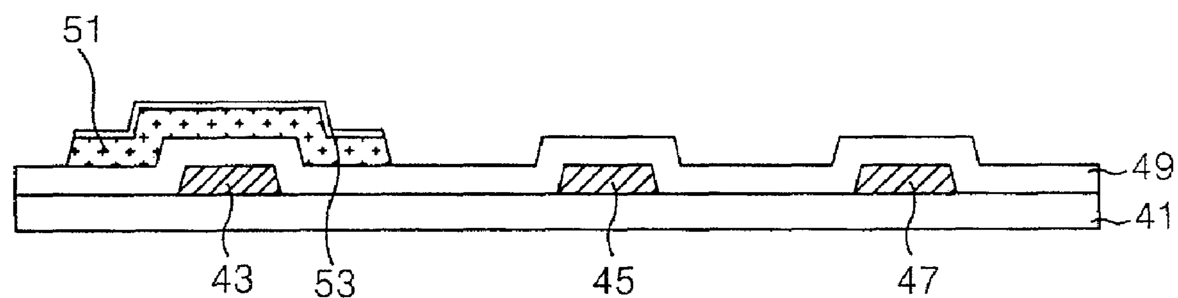
Figure 6C:
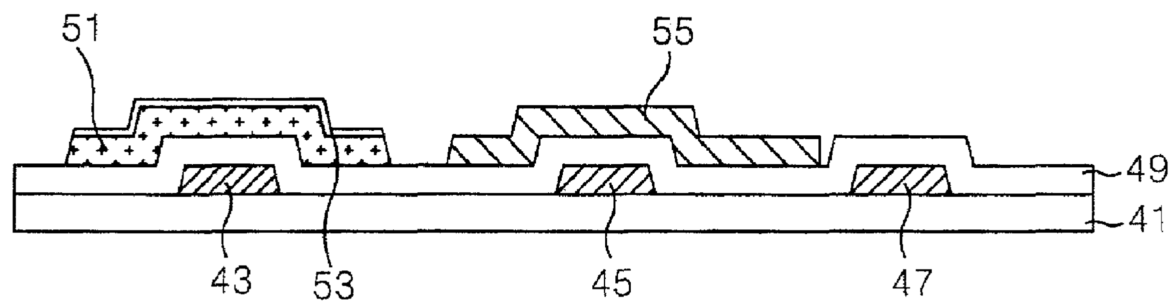
Figure 6D:
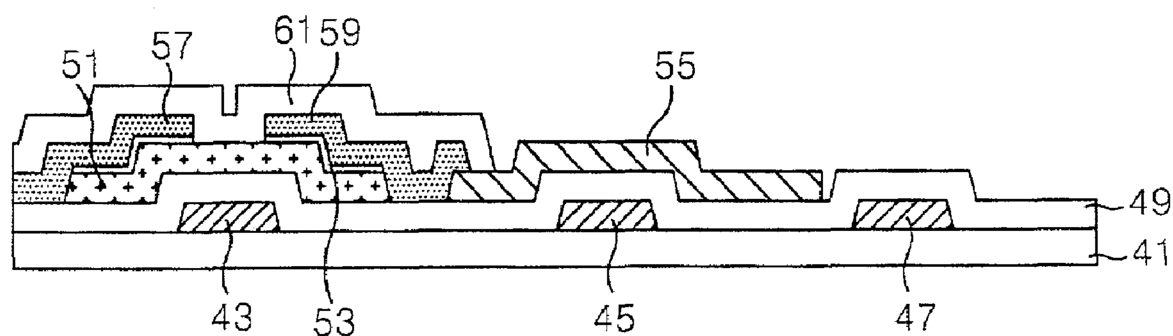
Figure 7:
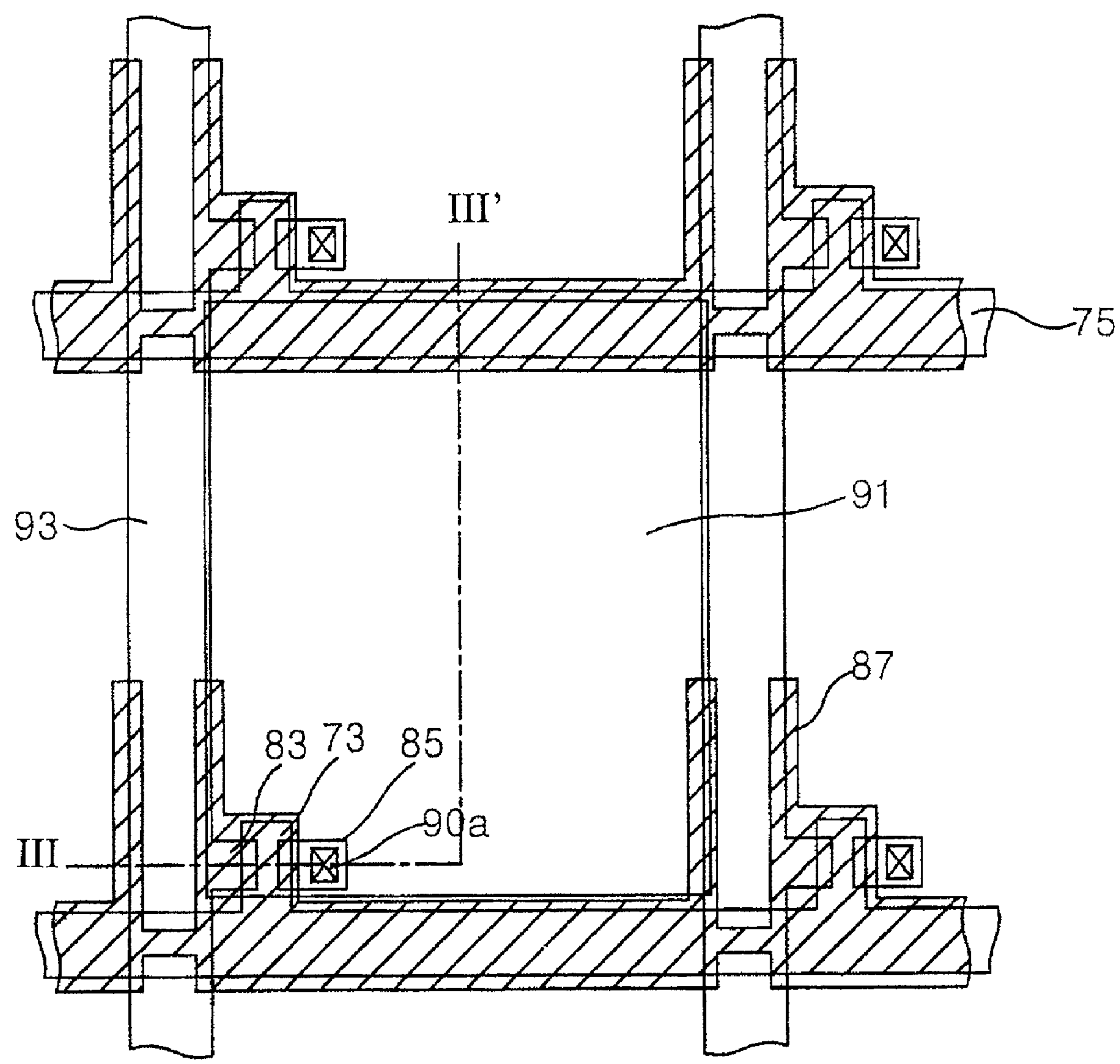
FIG. 7 is a plan view showing an exemplary array substrate of a liquid crystal display according to the present invention.
Figure 8:
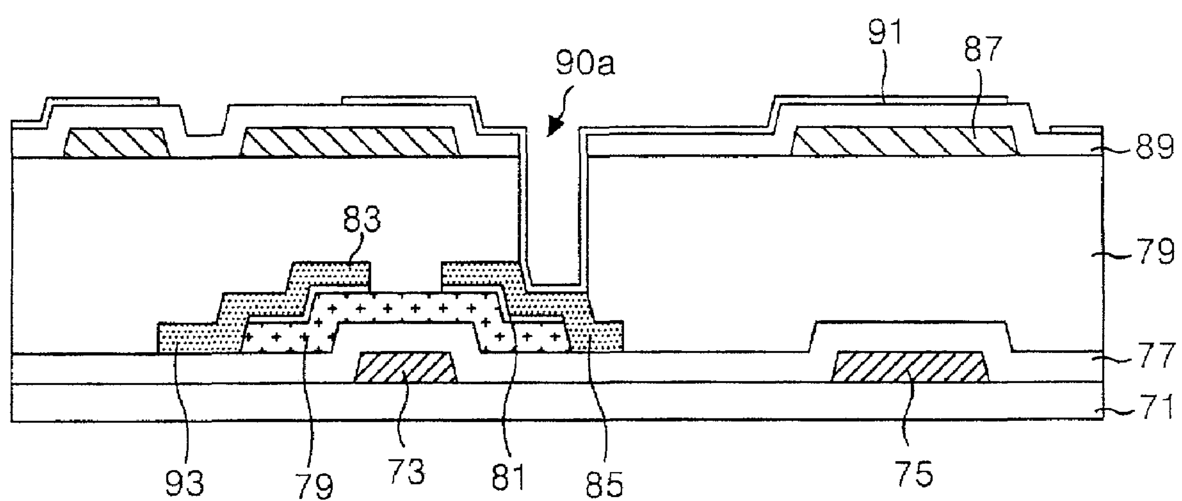
FIG. 8 is a cross sectional view of the array substrate taken along III–III' in FIG. 7.

FIG. 7 is a plan view showing an exemplary array substrate of a liquid crystal display according to the present invention, and FIG. 8 is a cross sectional view of the array substrate taken along III–III' in FIG. 7.

In FIGS. 7 and 8, a lower substrate 71 of an LCD may include a TFT arranged at an intersection between a gate line 75 and a data line 93, a pixel electrode 91 connected to a drain electrode 85 of the TFT, and a storage capacitor to overlap with a partial area of the gate line 75 and the data line 93.

The TFT may include a gate electrode 73 connected to the gate line 75, a source electrode 83 connected to the data line 93, and a drain electrode 85 connected, via a contact hole 90*a*, to the pixel electrode 91. Furthermore, the TFT may include a gate insulating film 77 insulating the gate electrode 73, and the source and drain electrodes 83 and 85, and semiconductor layers 79 and 81 defining a conduction channel between the source electrode 83 and the drain electrode 85 by application of a gate voltage to the gate electrode 73. Accordingly, the TFT responds to a gate signal from the gate line 75 to selectively apply a data signal from the data line 93 to the pixel electrode 91.

The pixel electrode 91 may be positioned on an upper insulating layer 89 at a cell area divided by the data line 93 and the gate line 75, and may be made from a transparent conductive material having a high light transmittance, for example. The pixel electrode 91 may use an organic protective film 79 having a small dielectric constant formed such that a portion overlaps the data line 93. Accordingly, the pixel electrode 91 may have an increased aperture ratio as compared to a pixel electrode that uses an inorganic protective film. The pixel electrode 91 may be electrically connected, via the contact hole 90*a* defined at the organic protective film 79 and the upper insulating film 89, to the drain electrode 85. The pixel electrode 91 generates a potential difference from a common transparent electrode (not shown) provided at an upper substrate (not shown) by a data signal applied via the TFT. The potential difference allows a liquid crystal positioned between the lower substrate 71 and the upper substrate (not shown) to change a liquid crystal molecule arrangement owing to its dielectric anisotropy characteristic. Accordingly, an arrangement of liquid crystal molecules is changed for each pixel in accordance with a data voltage applied via the TFT, thereby expressing image data (picture information) on the LCD.

The pixel electrode 91, the gate line 75, and a portion of the data line 93 should have a large capacitance value to maintain a stable pixel voltage. Accordingly, the storage capacitor may include a pixel electrode 91 electrically connected, via the contact hole 90*a*, to the drain electrode 85, and a capacitor common line 75 having the upper insulating film 89 disposed therebetween. The capacitor common line 87 may overlap the gate line 75, and a portion of the data line 93 to create a relatively large electrode area, thereby increasing a capacitance value of the storage capacitor. In addition, the capacitor common line 87 may overlap the gate line 75, and the data line 93 so as not to occupy additional area, thereby increasing an aperture ratio. The capacitor common line 75 may extend to be commonly connected to the common line 75 and apply a similar common voltage as the common electrode (not shown) of the upper substrate (not shown). Also, the capacitor common line 87 may serve as a black matrix for extinguishing light along the gate line 75 and the data line 93, whereby formation of an additional black matrix on the upper substrate is unnecessary.

FIGS. 9 to 14 are cross sectional views of an exemplary method of fabricating the array substrate of the LCD shown in FIG. 8 according to the present invention.

Figure 9A:
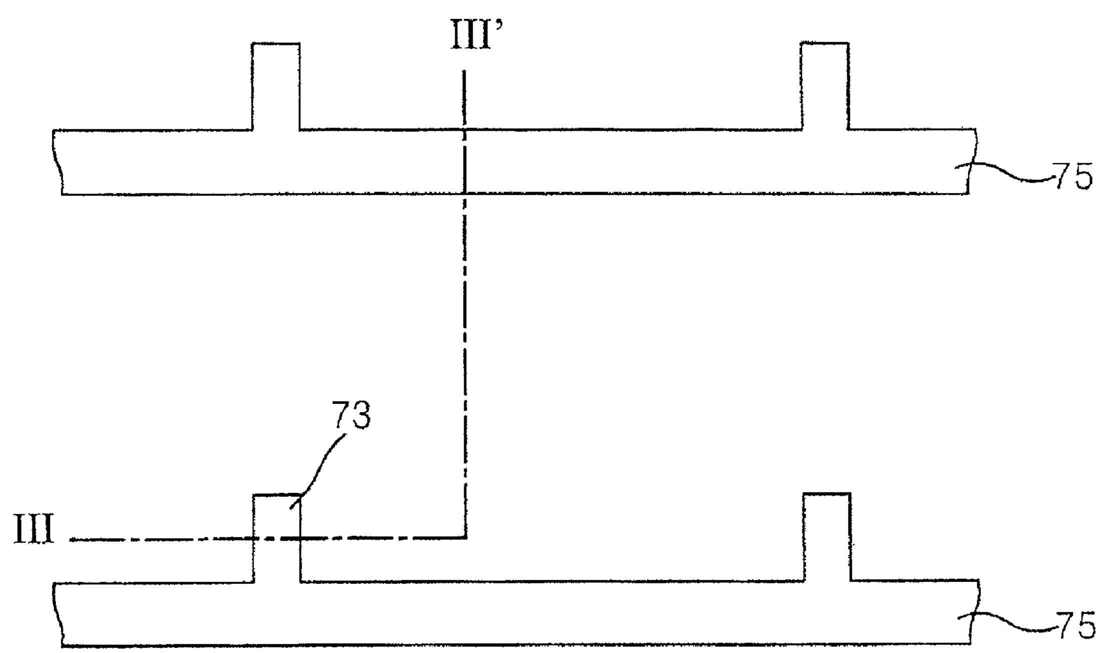
FIGS. 9 to 14 are cross sectional views of an exemplary method of fabricating the array substrate shown in FIG. 8 according to the present invention.
Figure 9B:
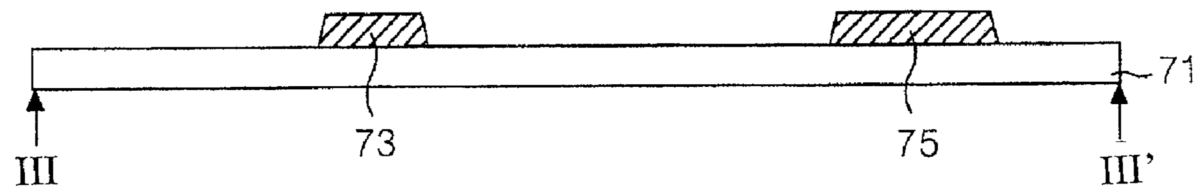

In FIGS. 9A and 9B, a gate electrode 73, and a gate line 75 may be provided on a substrate 71. The gate electrode 73 and the gate line 75 may be formed by depositing aluminum (Al) or copper (Cu) material, for example, using a deposition technique such as a sputtering, for example, and patterning the material.

Figure 10:
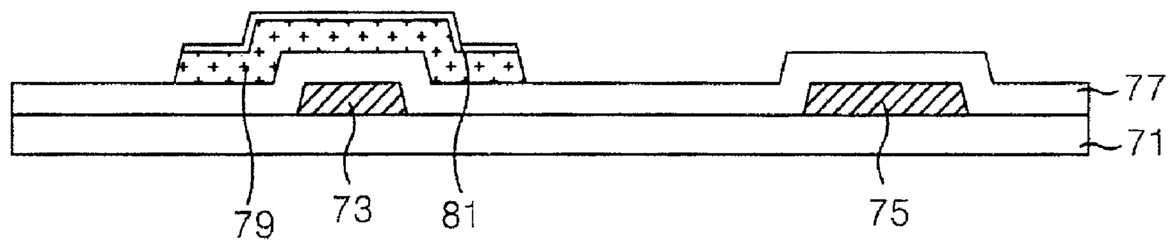

In FIG. 10, a gate insulating film 77, an active layer 79 and an ohmic contact layer 81 may be provided on the substrate 71. The gate insulating film 77 may be formed by depositing an insulating material such as silicon nitride ($SiN_x$) or silicon oxide ($SiO_x$), for example, onto the substrate 71 using a plasma enhanced chemical vapor deposition (PECVD) technique, for example, to cover the gate electrode 73 and the gate line 75. The active layer 79 and the ohmic contact layer 81 may be formed by sequentially depositing two semiconductor layers on the gate insulating film 77 and patterning the deposited semiconductor layers. The active layer 79 may be formed from amorphous silicon that is not doped with an impurity, for example, and the ohmic contact layer 81 may be formed from amorphous silicon doped with an n-type or p-type impurity at a high concentration, for example.

Figure 11A:
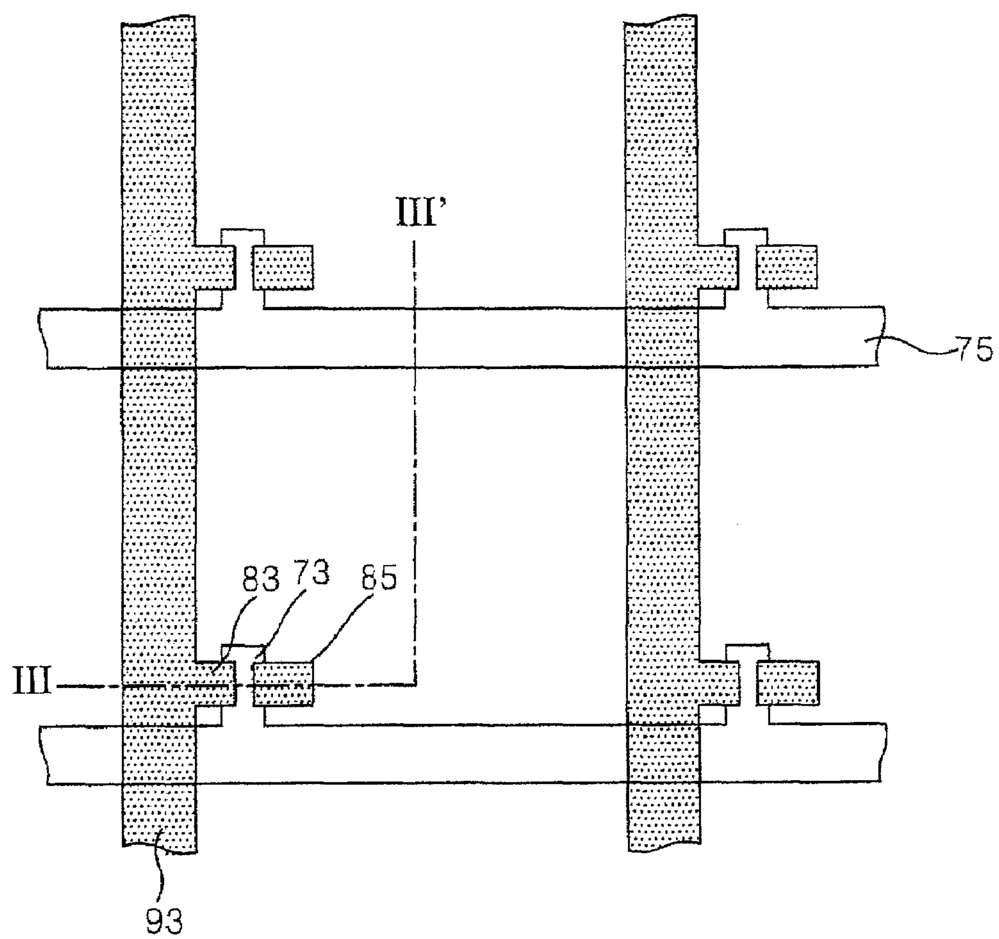
Figure 11B:
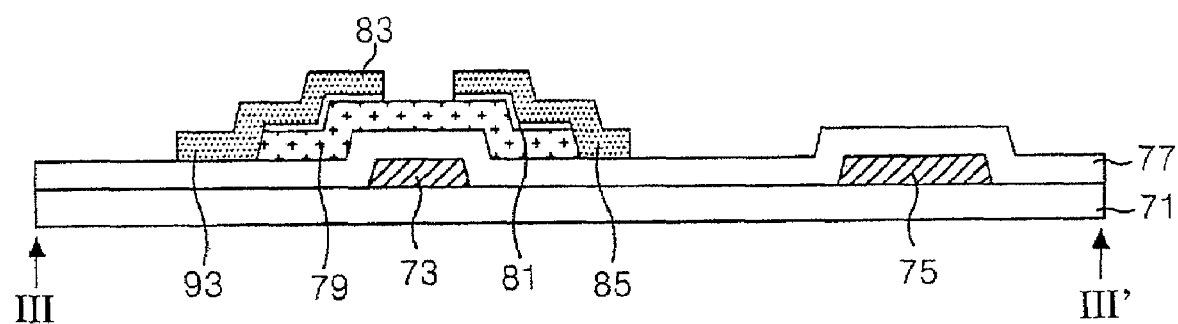

In FIGS. 11A and 11B, a data line 93, and source and drain electrodes 83 and 85 may be provided on the substrate 71. The data line 93, and the source and drain electrodes 83 and 85 may be formed by depositing a metal layer using CVD or sputtering techniques, for example, and patterning the metal layer. After the source and drain electrodes 83 and 85 are formed, the ohmic contact layer 81 at an area corresponding to the gate electrode 73 may be patterned to expose the active layer 79, thereby creating a channel within an area of the active layer 79 corresponding to the gate electrode 73 between the source and drain electrodes 83 and 85. The data line 93, and the source and drain electrodes 83 and 85 may include chrome (Cr) or molybdenum (Mo) material, for example.

Figure 12A:
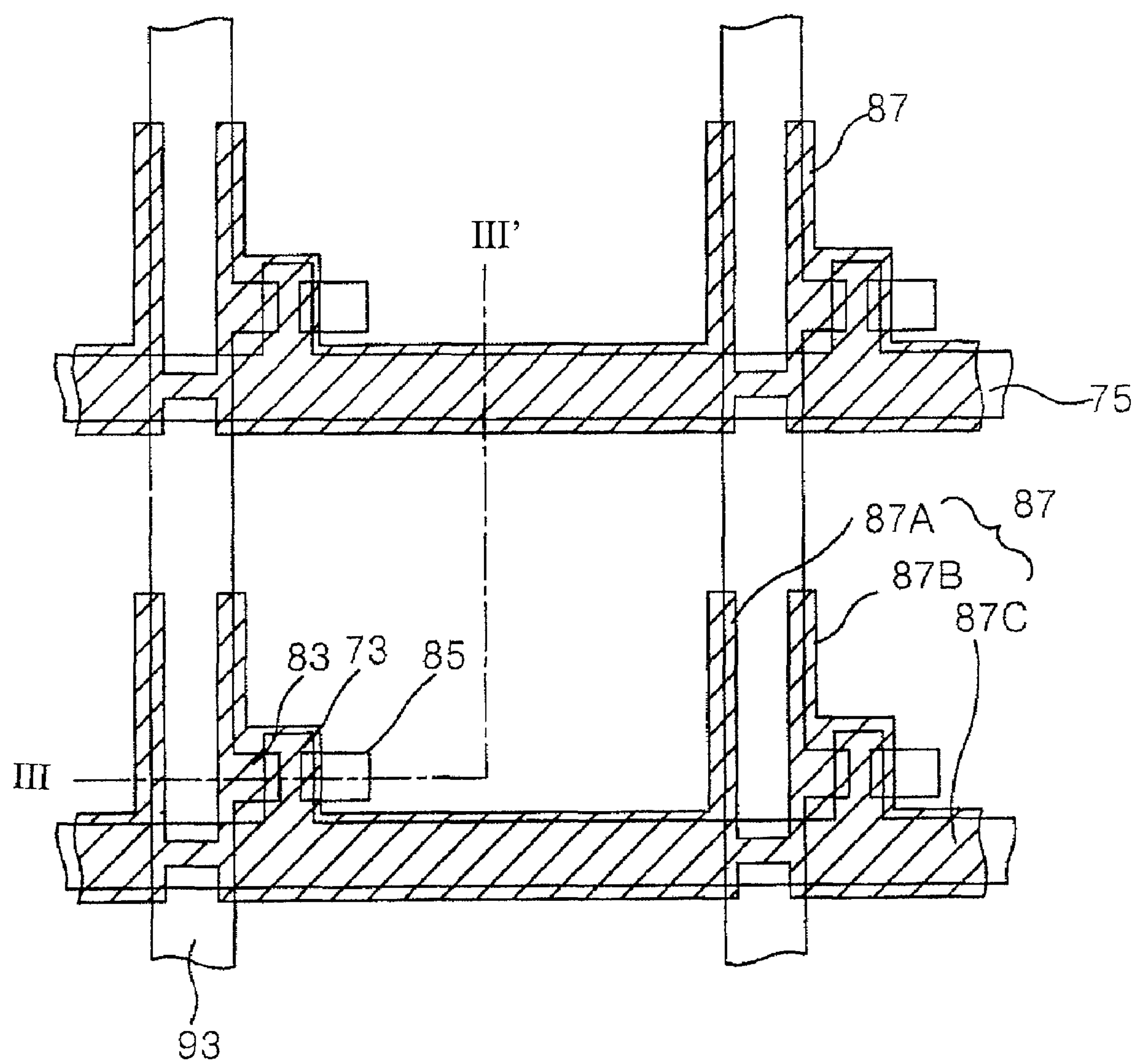
Figure 12B:
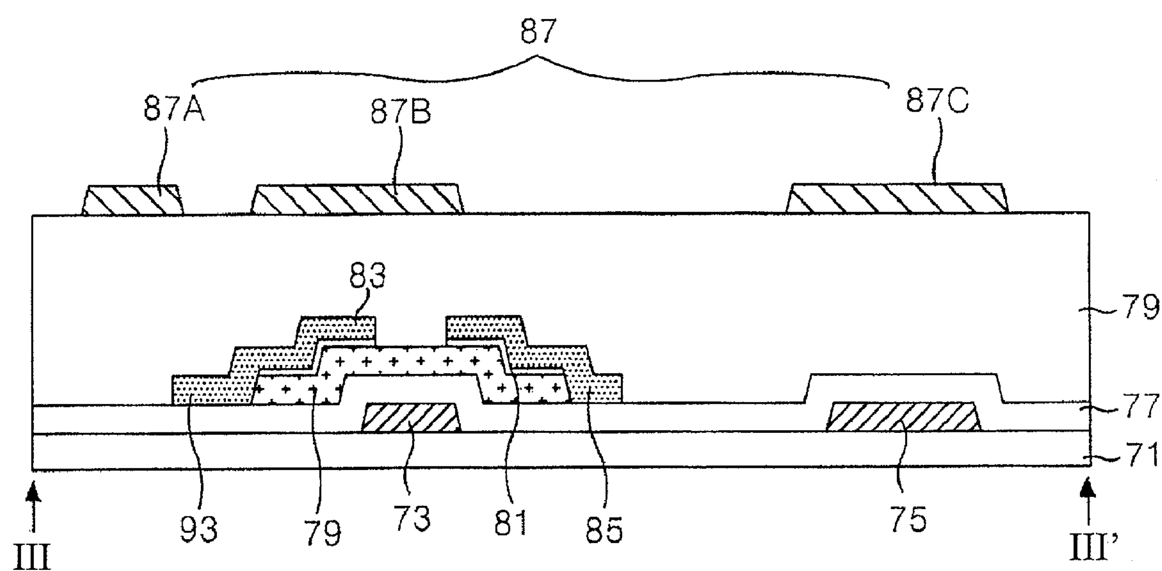

In FIGS. 12A and 12B, an organic protective film 79 and a capacitor common line 87 may be sequentially provided on the substrate 71. The organic protective film 79 may be formed by coating an insulating material on the gate insulating layer 77 using a spin coating technique to cover the source and drain electrodes 83 and 85, for example. Accordingly, a surface of the organic protective film 79 may be flattened. The capacitor common line 87 may be provided to overlap the gate line 75 and a portion of the data line 93 by depositing a conductive material on the organic protective film 79, for example, and patterning the material. Accordingly, the capacitor common line 87 may include a body 87C overlapping end portions of the pixel electrode 91, and the gate line 75, and two arms 87A and 87B connected to the body 87C and overlapping opposing sides of the data line 93. The body 87C of the capacitor common line 87 may be set to have a width larger than widths of each of the arms 87A and 87B.

The organic protective film 79 may be formed from an organic insulating material having a small dielectric constant such as Teflon7, benzocyclobutene (BCB), Cytop7 or perfluorocyclobutane (PFCB), for example. Preferably, a dielectric constant of the organic protective film 79 is between about 2 and about 4. In addition, a thickness of the organic protective film 79 is preferably between about 1 μm and about 3 μm to sufficiently reduce a parasitic capacitance formed at the overlapping portions between the capacitor common line 87 and the gate line 75.

Figure 13A:
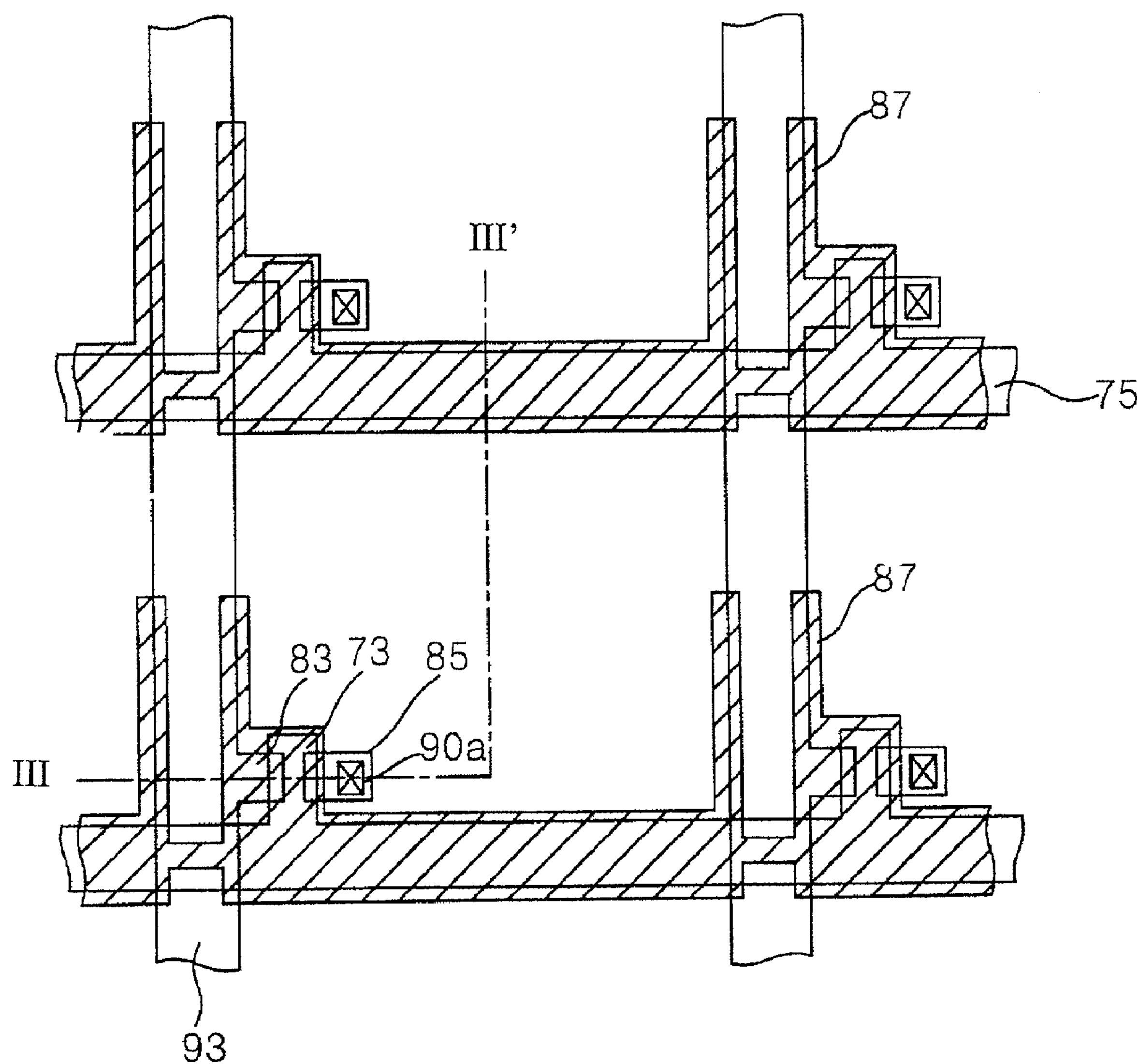
Figure 13B:
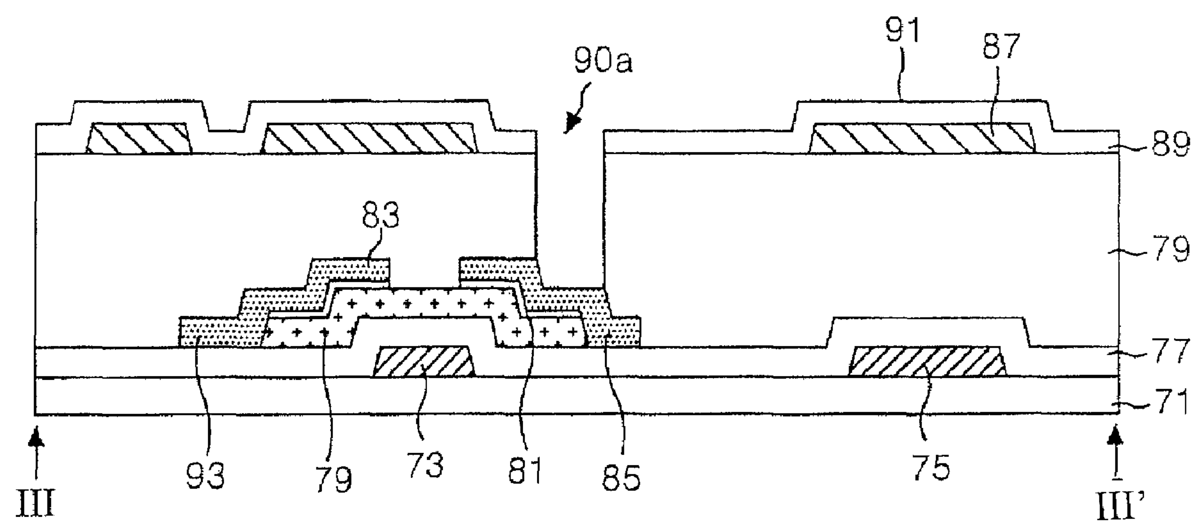

In FIGS. 13A and 13B, an upper insulating layer 89 may be provided on the organic protective film 79. The upper insulating layer 89 may be formed by depositing an insulating material on the organic protective film 79 using a plasma enhanced chemical vapor deposition (PECVD) technique, for example, to cover the capacitor common line 87. Subsequently, the upper insulating layer 89 and the organic protective film 79 may be patterned to form the contact hole 90*a* to expose the drain electrode 85. The upper insulating layer 89 may include an inorganic insulating material such as silicon nitride ($SiN_x$) or silicon oxide ($SiO_x$), for example.

Figure 14A:
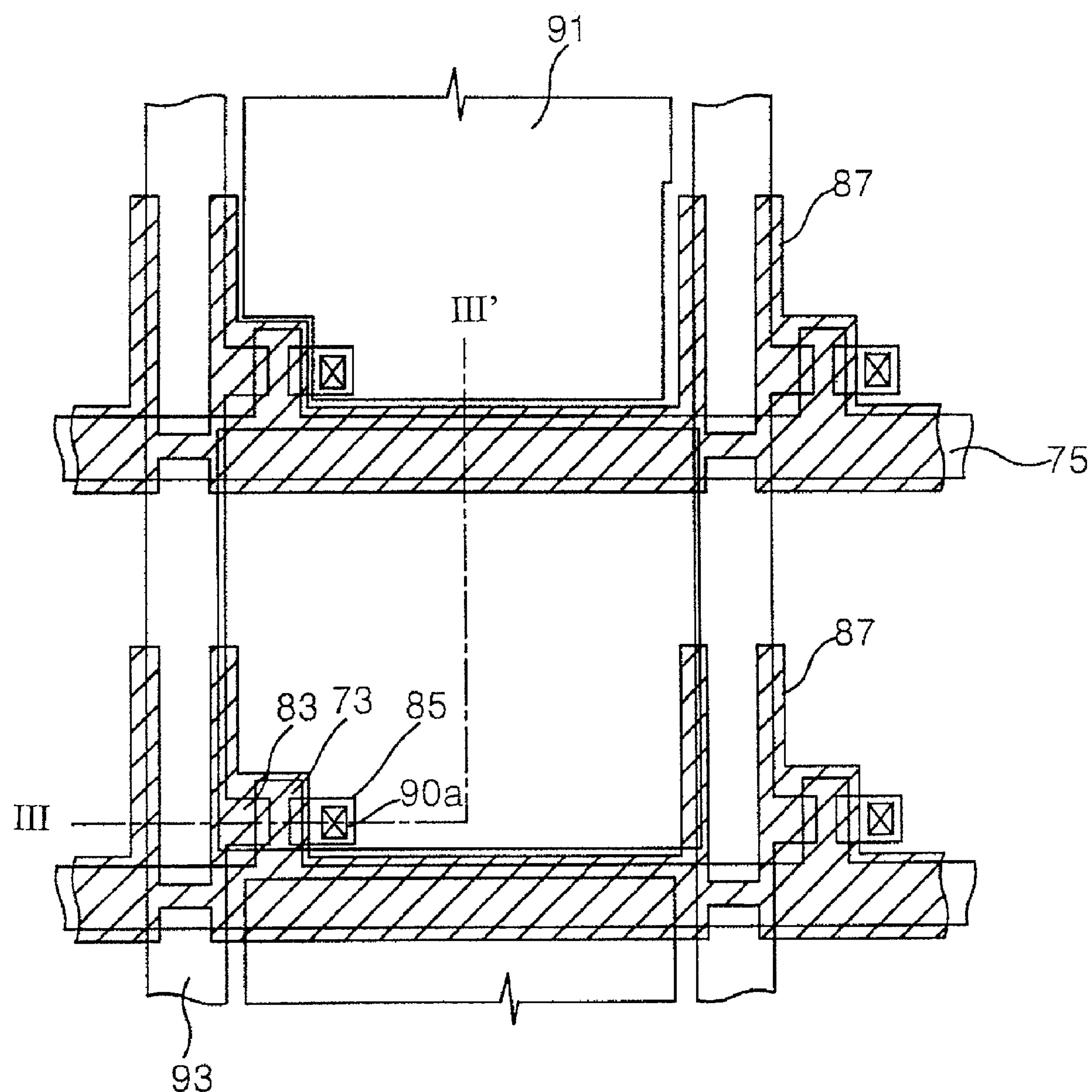
Figure 14B:
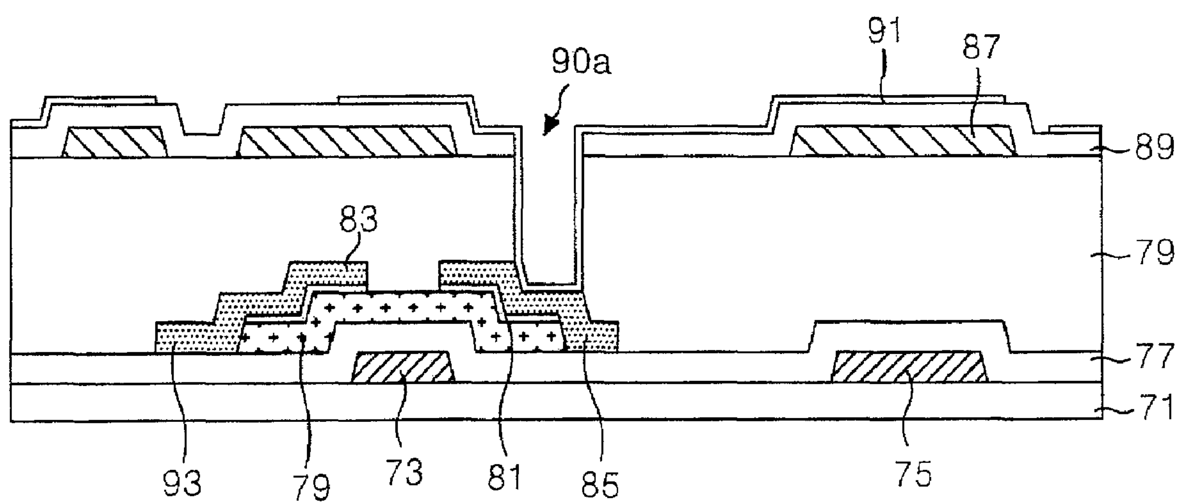

In FIGS. 14A and 14B, a pixel electrode 91 may be provided on the upper insulating layer 89. The pixel electrode 91 may be formed by depositing a transparent conductive material on the upper insulating layer 89, and patterning the material, for example. The pixel electrode 91 may be electrically connected, via the contact hole 90*a*, to the drain electrode 85, and may include any one of ITO, IZO and ITZO, for example.

Figure 15:
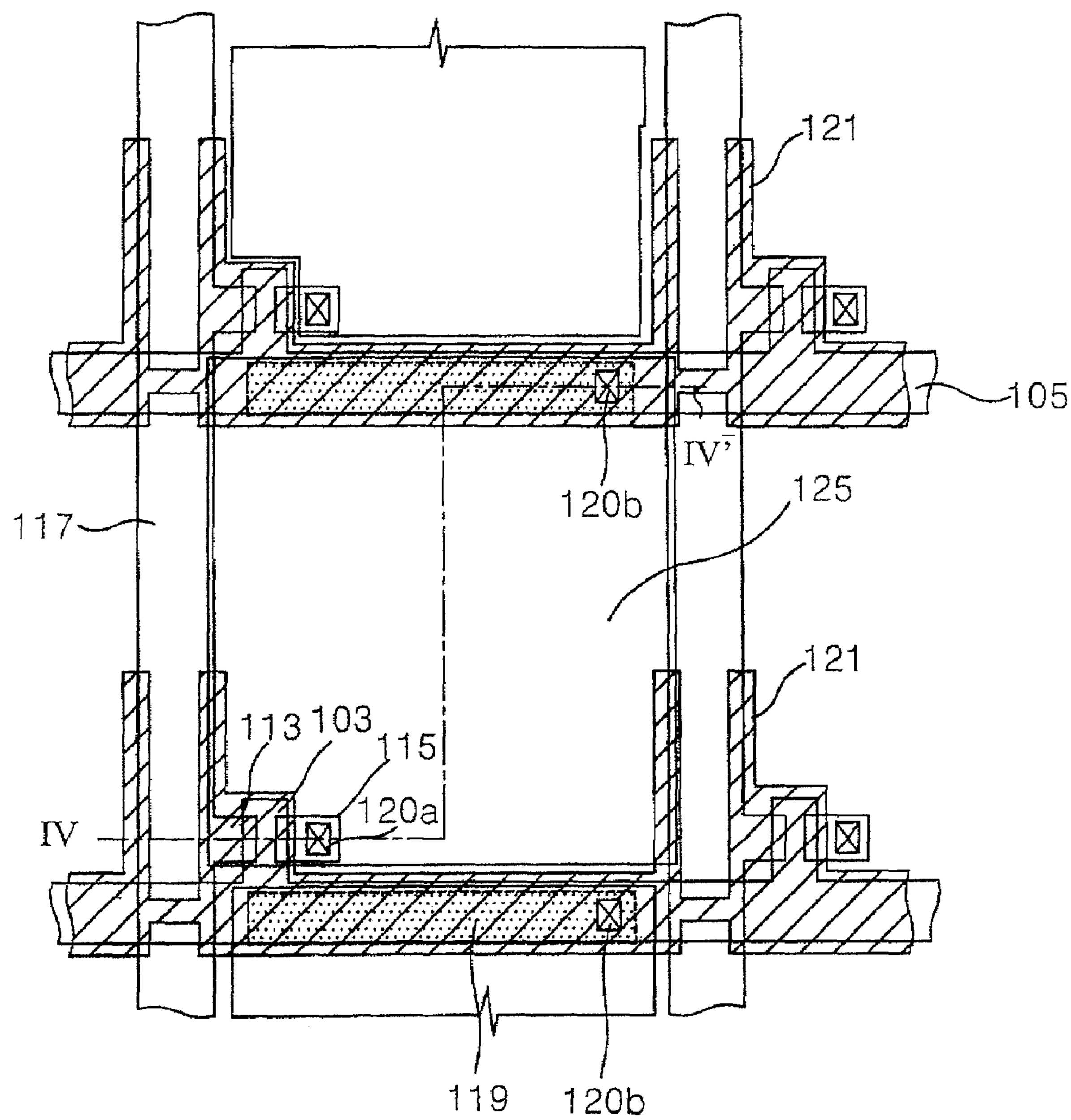
FIG. 15 is a plan view showing another exemplary array substrate of a liquid crystal display according to the present invention.
Figure 16:
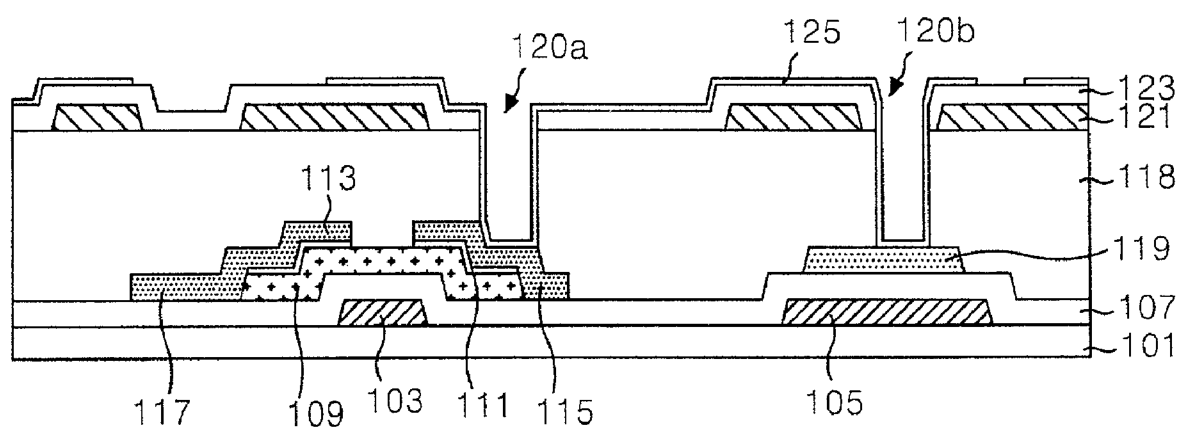
FIG. 16 is a cross sectional view of the array substrate taken along IV–IV' in FIG. 15.

FIG. 15 is a plan view showing another exemplary array substrate of a liquid crystal display according to the present invention, and FIG. 16 is a cross sectional view of the array substrate taken along IV–IV' in FIG. 15 according to the present invention.

In FIGS. 15 and 16, a lower substrate 101 of a LCD may include a TFT arranged at an intersection between a gate line 105 and a data line 117, a pixel electrode 125 connected to a drain electrode 115 of the TFT, and a storage capacitor positioned at an overlapping portion between the gate line 105 and a part of the data line 117.

The TFT may include a gate electrode 103 protruding from the gate line 105, a source electrode 113 protruding from the data line 117, and a drain electrode 115 connected, via a first contact hole 120*a*, to the pixel electrode 125. Furthermore, the TFT may include a gate insulating film 107 insulating the gate electrode 113 and the source and drain electrodes 113 and 115, and semiconductor layers 109 and 111 defining a conduction channel between the source electrode 113 and the drain electrode 115 by application of a gate voltage to the gate electrode 103. Accordingly, the TFT responds to a gate signal from the gate line 105 to selectively apply a data signal from the data line 117 to the pixel electrode 125.

The pixel electrode 125 may be positioned on an upper insulating layer 123 coated on an entire surface of the lower substrate 101 at a cell area divided by the data line 93 and the gate line 75. The pixel electrode may include a transparent conductive material having a high light transmittance, for example. The pixel electrode 125 may use an organic protective film 118 having a small dielectric constant such that a portion overlaps the data line 117. Accordingly, the pixel electrode may have an increased aperture ratio as compared to a pixel electrode that uses an inorganic protective film. The pixel electrode 125 may be electrically connected, via the first contact hole 120*a* defined by the upper insulating layer 123 and the organic protective film 118, to the drain electrode 115.

The storage capacitor should have a large capacitance to maintain a stable pixel voltage. Accordingly, the storage capacitor may include a parallel connection of a first storage capacitor of a storage-on-common system, and a second storage capacitor of a storage-on-gate system. The first storage capacitor may include the pixel electrode 125, and a capacitor common line 121 having an upper insulating layer 123 disposed therebetween with the capacitor common line 121 overlapping the gate line 105 and a portion of the data line 117. In addition, the capacitor common line 121 may serve as a black matrix for extinguishing light along the gate line 105 and the data line 117, whereby formation of an additional black matrix on the upper substrate is unnecessary. The second storage capacitor may include a capacitor electrode 119 connected, via a second contact hole 120*b*, to the pixel electrode 119, and the gate line having the gate insulating film 107 disposed therebetween.

A capacitance value of the storage capacitor is increased by a combination of the first and second storage capacitors. In addition, the capacitor common line 121 and the capacitor electrode 119 overlap with the gate line 105 and the data line 117 so as not to occupy additional area, thereby increasing an aperture ratio.

FIGS. 17 to 22 are cross sectional views of another exemplary method of fabricating the array substrate of the LCD shown in FIG. 16 according to the present invention.

Figure 17A:
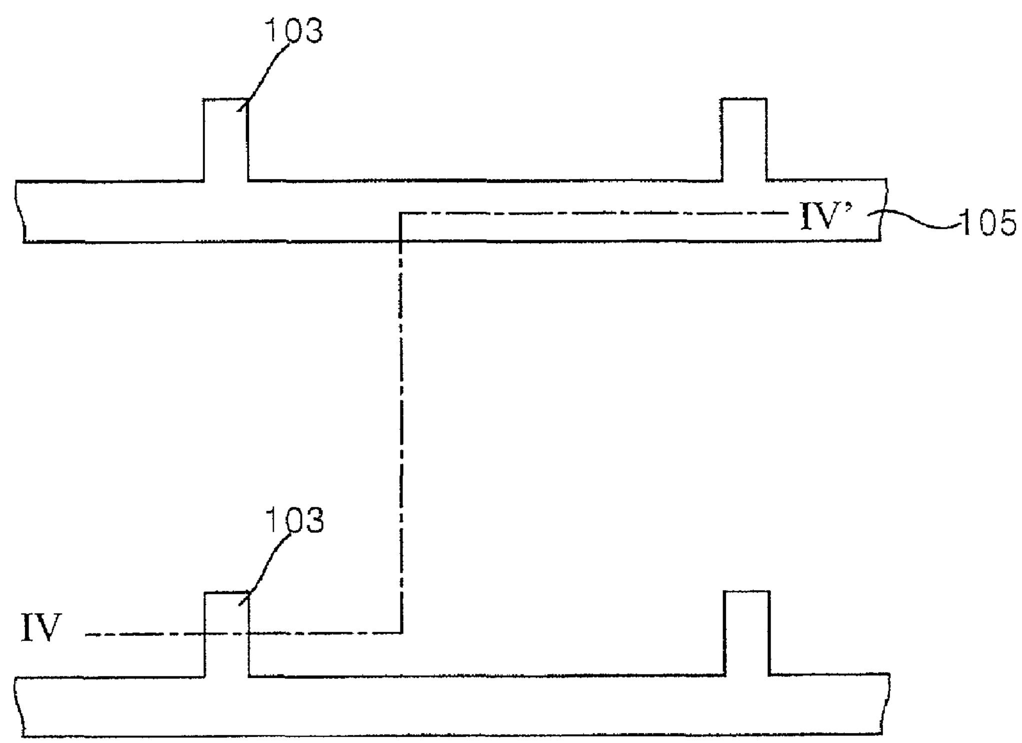
FIGS. 17 to 22 are cross sectional views of another exemplary method of fabricating the array substrate shown in FIG. 16 according to the present invention.
Figure 17B:
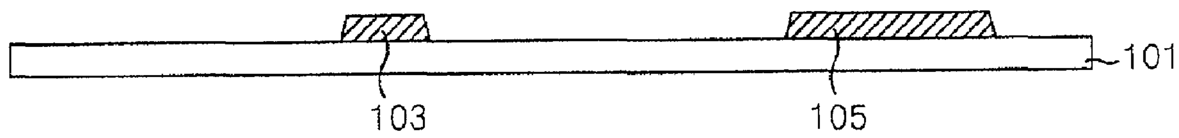

In FIGS. 17A and 17B, a gate electrode 103 and a gate line 105 may be provided on a substrate 101. The gate electrode 103 and the gate line 105 may be formed by depositing aluminum (Al) or copper (Cu) material, for example, using a deposition technique such as a sputtering, for example, and patterning the material.

Figure 18:
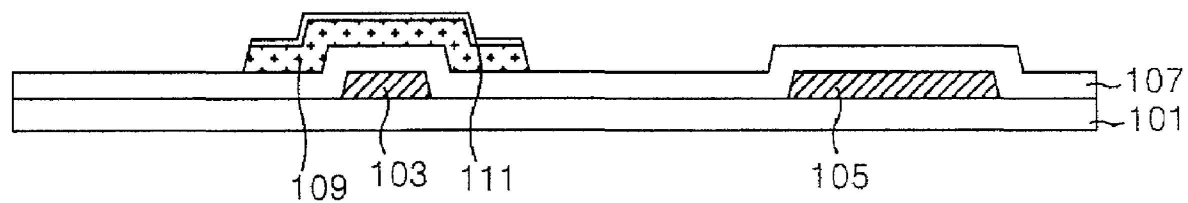

In FIG. 18, a gate insulating film 107, an active layer 109 and an ohmic contact layer 111 may be provided on the substrate 101. The gate insulating film 107 may be formed by depositing an insulating material such as silicon nitride ($SiN_x$) or silicon oxide ($SiO_x$), for example, onto the substrate 101 using a plasma enhanced chemical vapor deposition (PECVD) technique, for example, to cover the gate electrode 103 and the gate line 105. The active layer 109 and the ohmic contact layer 111 may be formed by sequentially depositing two semiconductor layers on the gate insulating film 107 and patterning the deposited semiconductor layers. The active layer 109 may be formed from amorphous silicon that is not doped with an impurity, for example, and the ohmic contact layer 111 may be formed from amorphous silicon doped with an n-type or p-type impurity at a high concentration, for example.

Figure 19A:
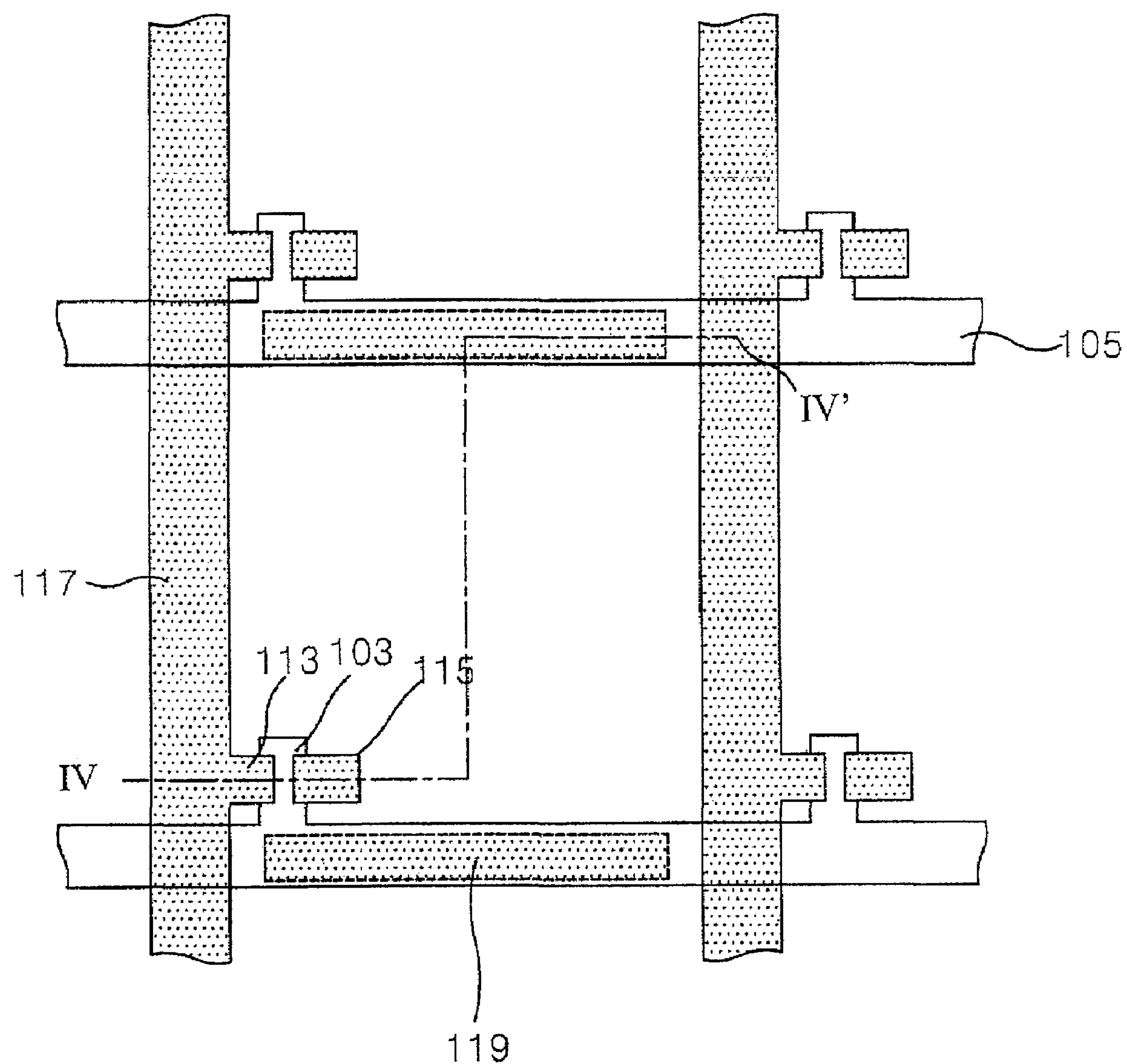
Figure 19B:
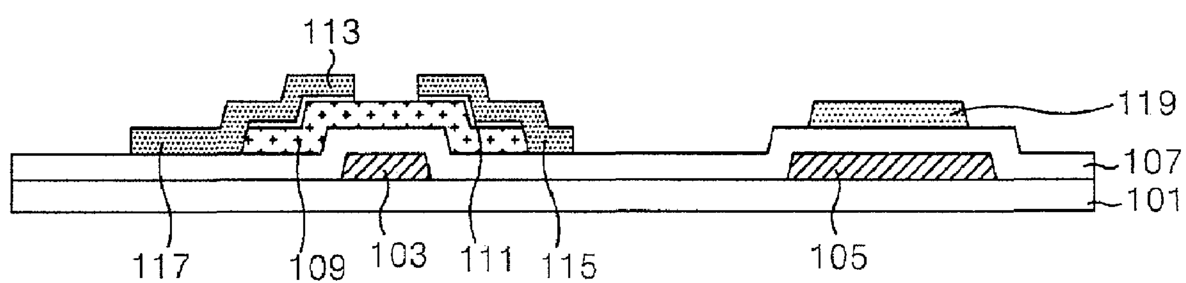

In FIGS. 19A and 19B, a data line 117, source and drain electrodes 113 and 115, and a capacitor electrode 119 may be provided on the substrate 101. The data line 117, the source and drain electrodes 113 and 115, and the capacitor electrode 119 may be formed by depositing a metal layer using CVD or sputtering techniques, for example, and patterning the metal layer. The data line 117, the source and drain electrodes 113 and 115, and the capacitor electrode 119 may include chrome (Cr) or molybdenum (Mo) material, for example. Next, a portion of the ohmic contact layer 111 at an area corresponding to the gate electrode 103 may be patterned to expose the active layer 109, thereby creating a channel within an area of the active layer 109 corresponding to the gate electrode 103 between the source and drain electrodes 113 and 115.

Figure 20A:
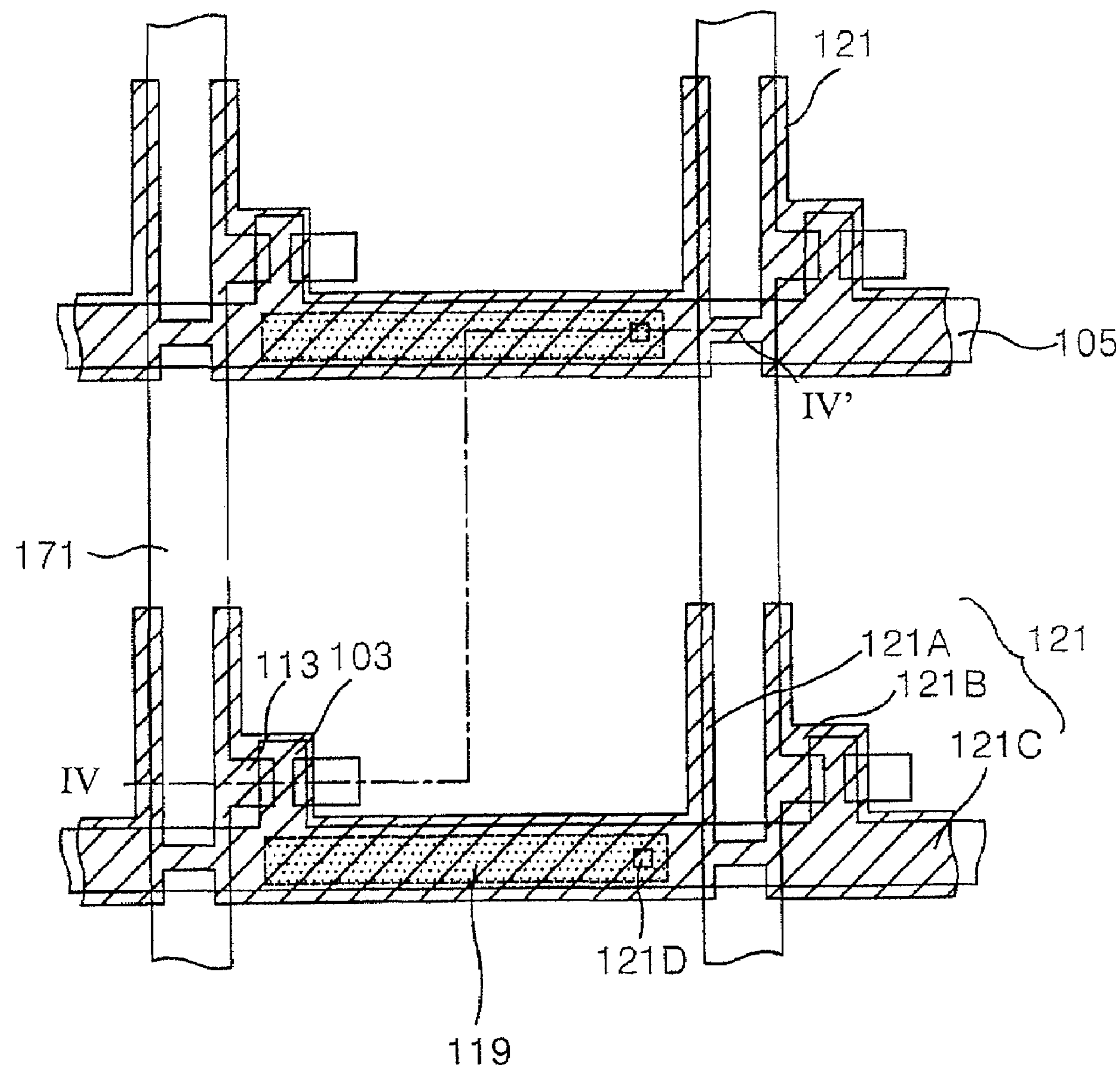
Figure 20B:
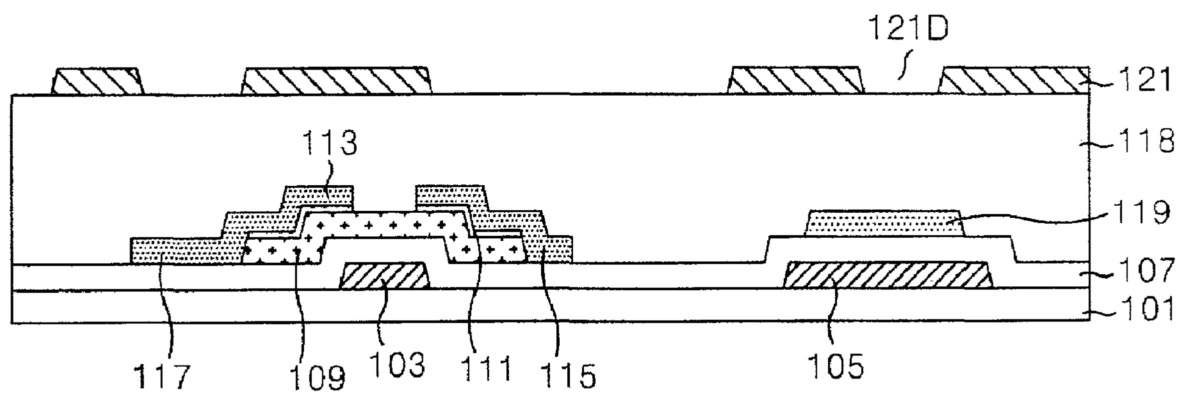

In FIGS. 20A and 20B, an organic protective film 118 and a capacitor common line 121 may be sequentially provided on the substrate 101. The organic protective film 118 may be formed by coating an insulating material on the gate insulating layer 107 using a spin coating technique, for example, to cover the source and drain electrodes 113 and 115. Accordingly, a surface of the organic protective film 118 may be flattened. The capacitor common line 121 may be provided to overlap the gate line 105 and a portion of the data line 117 by depositing a transparent conductive material onto the organic protective film 118, for example, and patterning the material. Accordingly, the capacitor common line 121 may include a body 121C overlapping upper end portions of the pixel electrode 125 and the gate line 105, and two arms 121A and 121B connected to the body 121C and overlapping opposing sides of the data line 121. The body 121C of the capacitor common line 121 may be set to have a width larger than each of the arms 121A and 121B. In particular, a hole 121D may be defined at a portion where a contact hole is to be formed during post-processing in the body 121C of the capacitor common line 121 overlapping the storage capacitor 119.

The organic protective film 118 may be formed from an organic insulating material having a small dielectric constant such as Teflon7, benzocyclobutene (BCB), Cytop7 or perfluorocyclobutane (PFCB). Preferably, a dielectric constant of the organic protective film 118 is between about 2 and about 4. In addition, a thickness of the organic protective film 118 is preferably between about 1 μm and about 3 μm to sufficiently reduce a parasitic capacitance formed at the overlapping portions between the capacitor common line 121 and the gate line 105.

Figure 21A:
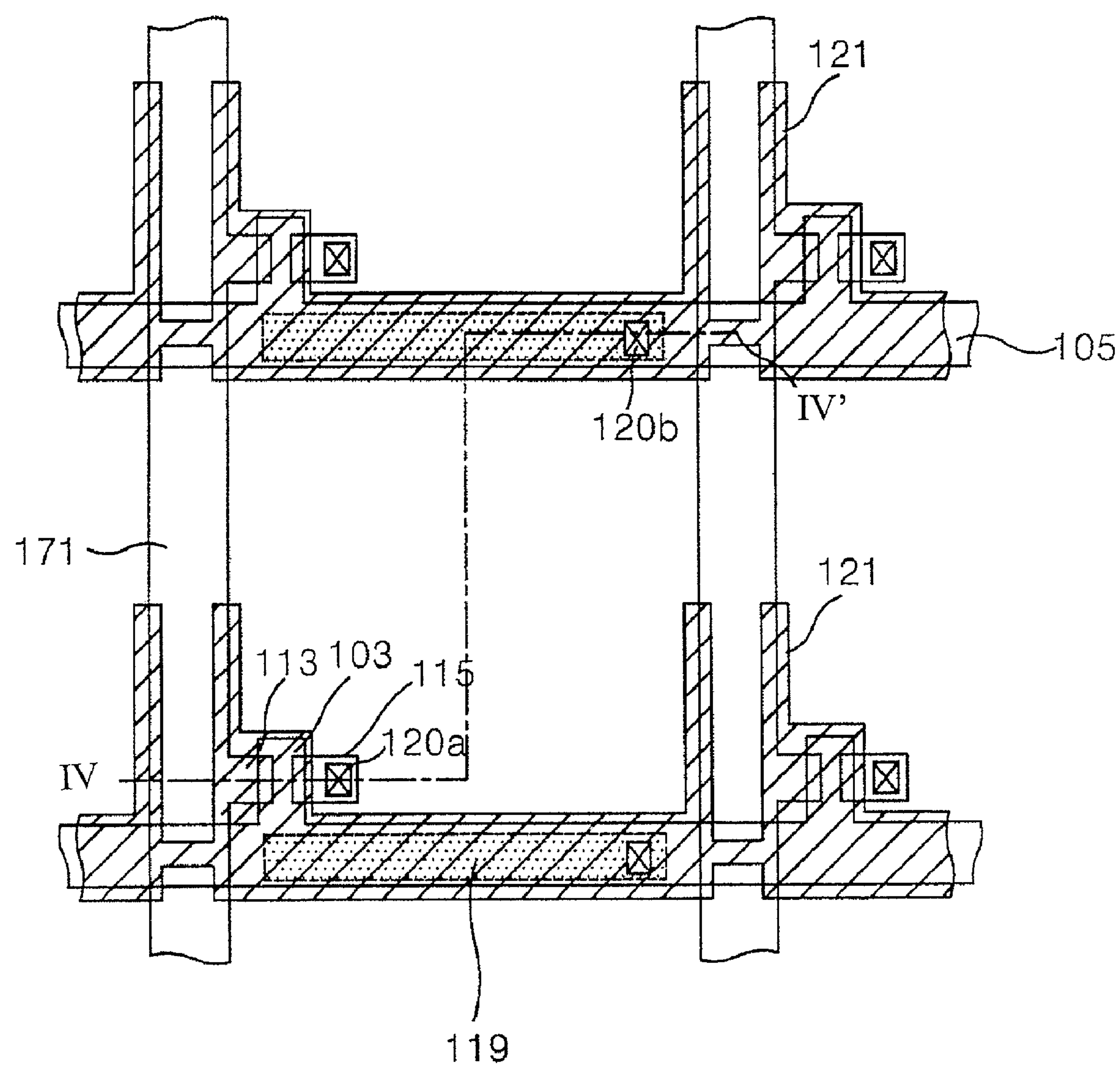
Figure 21B:
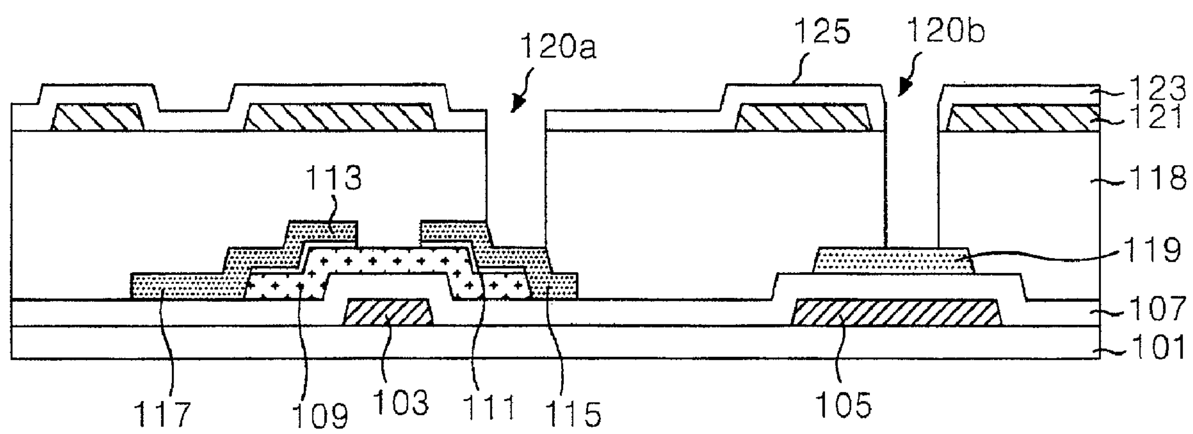

In FIGS. 21A and 21B, an upper insulating layer 123, and first and second contact holes 120*a* and 120*b* may be provided in the organic protective film 118. The upper insulating layer 123 may be formed by depositing an insulating material on the organic protective film 118 using a plasma enhanced chemical vapor deposition (PECVD) technique, for example, to cover the capacitor common line 121. Subsequently, the upper insulating layer 123 and the organic protective film 118 may be simultaneously patterned to form the first and second contact holes 120*a* and 120*b* to expose the drain electrode 115, and the capacitor electrode 119, respectively. The upper insulating layer 123 may include an inorganic insulating material such as silicon nitride ($SiN_x$) or silicon oxide ($SiO_x$), for example.

Figure 22A:
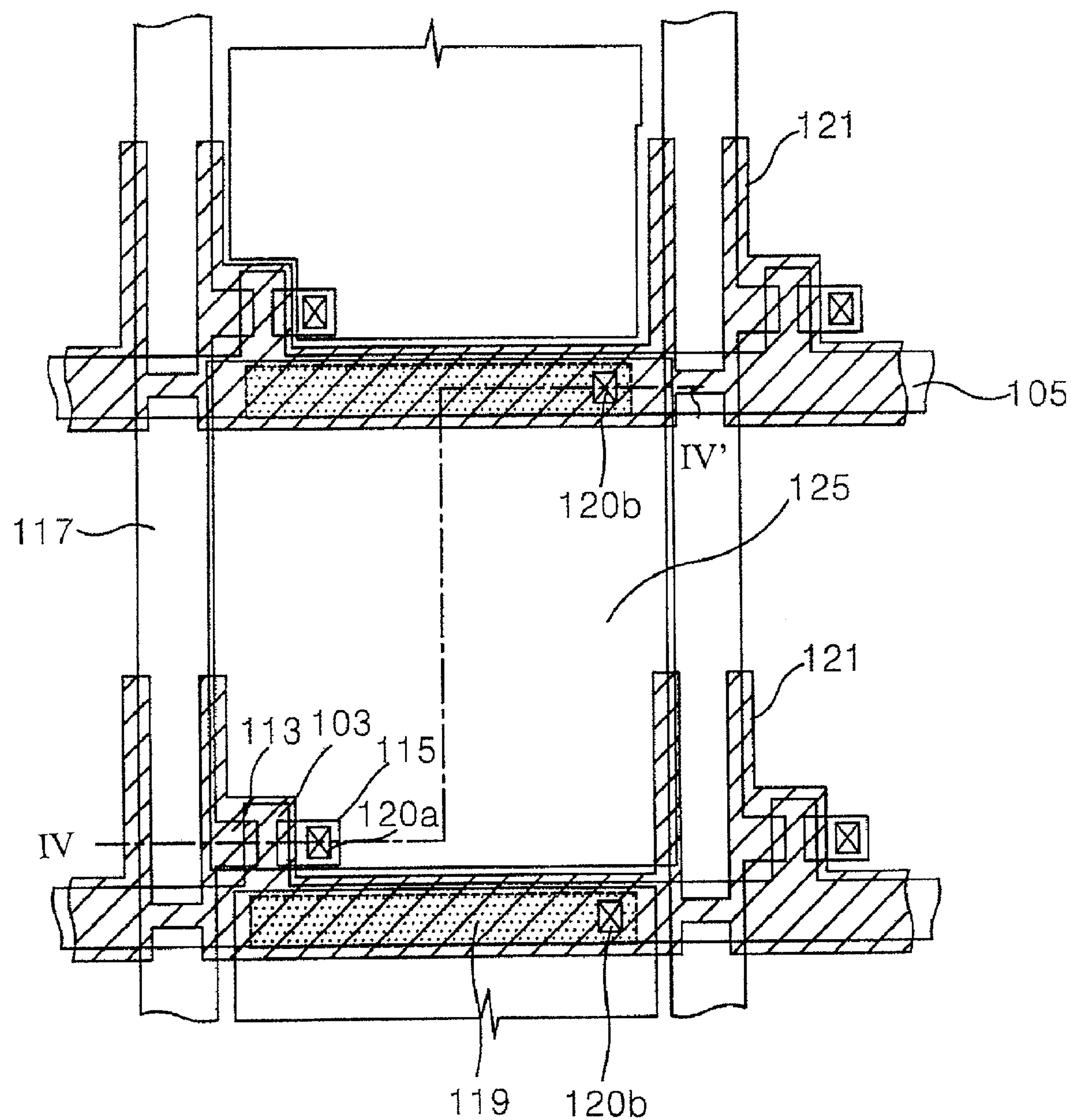
Figure 22B:
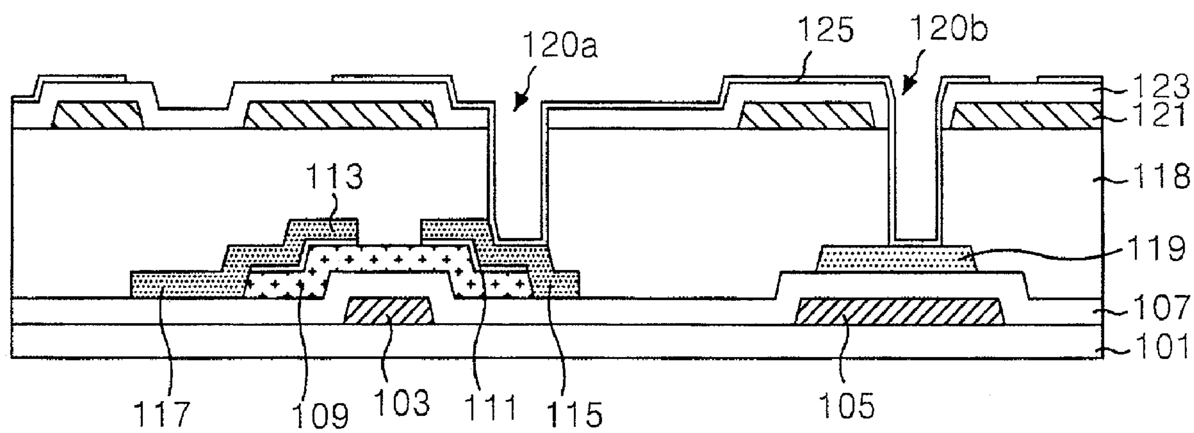

In FIGS. 22A and 22B, a pixel electrode 125 may be provided on the upper insulating layer 125. The pixel electrode 125 may be formed by depositing a transparent conductive material on the upper insulating layer 123, and patterning the material, for example. The pixel electrode 125 may be electrically connected, via the first contact hole 120*a*, to the drain electrode 115, and may include. Moreover, the pixel electrode 125 may electrically contact the capacitor electrode 119 through the second contact hole 120*b*. The pixel electrode 125 may include any one of ITO, IZO and ITZO, for example.

It will be apparent to those skilled in the art that various modifications and variations can be made in the array substrate of an liquid crystal display and fabricating method thereof of the present invention without departing from the spirit or scope of the invention. Thus, it is intended that the present invention cover the modifications and variations of this invention provided they come within the scope of the appended claims and their equivalents.

What is claimed is:

1. An array substrate of a liquid crystal display, comprising:

a gate line;

a data line crossing the gate line to define a pixel region;

a thin film transistor electrically connected to the pixel region, the thin film transistor includes a gate electrode connected to the gate line, a semiconductor layer having first and second sides, a source electrode contacting the first side of the semiconductor layer and connected to the data line, and a drain electrode contacting the second side of the semiconductor layer;

a gate insulating film provided between the gate line and the data line;

an organic protective film formed on the gate insulating film;

a capacitor common line provided on the organic protective film to overlap the gate line;

an upper insulating layer provided on the organic protective film; and a pixel electrode provided on the upper insulating layer partially overlapping the capacitor common line and the data line, the pixel electrode electrically connected to the data line via the thin film transistor, wherein the pixel electrode is connected to the drain electrode via a contact hole through the upper insulating layer and the organic protective film and the pixel electrode overlaps the gate electrode.

2. The array substrate according to claim 1, wherein the capacitor common line includes an arm member partially overlapping opposing side portions of the data line.

3. The array substrate according to claim 1, wherein the organic protective film includes an organic insulating material selected from one of an acrylic organic compound, Teflon®, benzocyclobutene (BCB), Cytop® and perfluorocyclobutane (PFCB).

4. The array substrate according to claim 1, wherein a thickness of the organic protective film is between of about 1 μm and about 3 μm.

5. The array substrate according to claim 1, wherein the upper insulating layer includes an inorganic insulating material selected from one of silicon nitride ($SiN_x$) or silicon oxide ($SiO_x$).

6. A method of fabricating an array substrate of a liquid crystal display, comprising the steps of:

forming a gate line and a gate electrode connected to the gate line on a substrate, the gate electrode being a portion of a thin film transistor;

forming a gate insulating film on the substrate;

forming a semiconductor layer overlapping the gate electrode;

forming a data line crossing the gate line to define a pixel region corresponding to the thin film transistor, a source electrode on a first side of the semiconductor layer and connected to the data line, and a drain electrode on a second side of the semiconductor layer, the source and drain electrodes being a portion of the thin film transistor and electrically connected to the pixel region;

forming an organic protective film on the gate insulating film;

forming a capacitor common line overlapping the gate line;

forming an upper insulating layer on the organic protective film;

forming a contact hole through the upper insulating layer and the organic protective film; and forming a pixel electrode of the pixel region partially overlapping the capacitor common line and the data line, the pixel electrode electrically connected to the data line via the thin film transistor, wherein the pixel electrode is connected to the dram electrode via the contact hole and the pixel electrode overlaps the gate electrode.

7. The method according to claim 6, further comprising the step of forming an arm member extending from the capacitor common line during the step of forming the capacitor common line to partially overlap opposing side portions of the data line.

8. An array substrate of a liquid crystal display, comprising:

a gate line;

a data line crossing the gate line to define a pixel region;

a gate insulating film between the gate line and the data line;

a thin film transistor connected to the gate line and the data line defining the pixel region;

a pixel electrode of the pixel region connected to the thin film transistor, the pixel electrode partially overlapping the gate line and the data line with an organic protective film and an upper dielectric layer therebetween; and a storage capacitor including at least a capacitor common line overlapping the gate line, wherein the pixel electrode overlaps the capacitor common line and a gate electrode of the thin film transistor.

9. The array substrate according to claim 8, wherein the capacitor common line includes an arm member partially overlapping opposing side portions of the data line.

* * * * *